US012785194B2

(12) United States Patent
Gao et al.

(10) Patent No.: US 12,785,194 B2
(45) Date of Patent: Nov. 3, 2026

(54) POWER DISTRIBUTION APPARATUS, BATTERY PACK, AND VEHICLE

(71) Applicant: BYD COMPANY LIMITED, Shenzhen (CN)

(72) Inventors: Jian Gao, Shenzhen (CN); Congji E, Shenzhen (CN); Xiaopeng Zhao, Shenzhen (CN); Qingbo Peng, Shenzhen (CN); Zhenhan Wu, Shenzhen (CN); Chengzhi Wang, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 293 days.

(21) Appl. No.: 18/621,823

(22) Filed: Mar. 29, 2024

(65) Prior Publication Data

US 2024/0239282 A1 Jul. 18, 2024

Related U.S. Application Data

(63) Continuation of application No. PCT/CN2022/132834, filed on Nov. 18, 2022.

(30) Foreign Application Priority Data

Dec. 20, 2021 (CN) ......................... 202123233795.5
Feb. 25, 2022 (CN) ......................... 202210182099.6

(51) Int. Cl.
*H01M 50/249* (2021.01)
*H01M 10/42* (2006.01)
(Continued)

(52) U.S. Cl.
CPC ....... *H01M 50/249* (2021.01); *H01M 10/425* (2013.01); *H01M 50/284* (2021.01);
(Continued)

(58) Field of Classification Search
CPC .... B60R 16/033; B60L 50/64; H01M 50/249; H01M 50/284–287; H01M 50/50–598;
(Continued)

(56) References Cited

U.S. PATENT DOCUMENTS

2009/0142940 A1* 6/2009 Ikeda ....................... H05K 1/18
439/76.2
2012/0251866 A1 10/2012 Matejek et al.
(Continued)

FOREIGN PATENT DOCUMENTS

CN 206471638 U 9/2017
CN 108075062 A * 5/2018 .......... H01M 10/425
(Continued)

OTHER PUBLICATIONS

English machine translation of CN212861166U published Apr. 2, 2021. (Year: 2021).*

(Continued)

*Primary Examiner* — Rexford N Barnie
*Assistant Examiner* — David A Shiao
(74) *Attorney, Agent, or Firm* — Sheppard Mullin Richter & Hampton LLP

(57) ABSTRACT

A power distribution apparatus includes: a base, a high-voltage connection part and a low-voltage connection part being fixed on the base, a high-voltage loop, a circuit board disposed on the base, a low-voltage loop integrated into the circuit board and electrically connected to the low-voltage connection part, and tabs. At least a portion of the high-voltage loop is disposed on the base. The high-voltage loop is electrically connected to the high-voltage connection part, has a positive-electrode connection end and a negative-electrode connection end, and includes a disconnecting switch core fixed on the base. A first end of each of the tabs is electrically connected to the high-voltage loop, and a
(Continued)

second end of each of the tabs is plugged into the circuit board for electrical connection with the low-voltage loop.

18 Claims, 8 Drawing Sheets

(51) Int. Cl.
*H01M 50/284* (2021.01)
*H05K 5/00* (2006.01)
*B60L 50/64* (2019.01)
*B60R 16/033* (2006.01)
*H02B 1/24* (2006.01)

(52) U.S. Cl.
CPC ............ *H05K 5/0026* (2013.01); *B60L 50/64* (2019.02); *B60R 16/033* (2013.01); *H01M 2220/20* (2013.01); *H02B 1/24* (2013.01)

(58) Field of Classification Search
CPC ......... H01M 10/425–4264; H01M 2010/4271; H02B 1/04–0565; H02B 1/24; H05K 5/0026–0082; H05K 2201/10621–10992
See application file for complete search history.

(56) References Cited

U.S. PATENT DOCUMENTS

2013/0099765 A1 4/2013 Girard et al.
2016/0093848 A1* 3/2016 DeKeuster ........ H01M 10/0525 429/151

FOREIGN PATENT DOCUMENTS

| | | | |
|---|---|---|---|
| CN | 108128180 | A | 6/2018 |
| CN | 207644176 | U | 7/2018 |
| CN | 108550757 | A | 9/2018 |
| CN | 109591727 | A | 4/2019 |
| CN | 208904401 | U | 5/2019 |
| CN | 210245965 | U | 4/2020 |
| CN | 210272587 | U | 4/2020 |
| CN | 210805903 | U | 6/2020 |
| CN | 111572347 | A | 8/2020 |
| CN | 111645618 | A | 9/2020 |
| CN | 109591727 | B | 2/2021 |
| CN | 212810384 | U | 3/2021 |
| CN | 212861166 | U | 4/2021 |
| CN | 112996243 | A | 6/2021 |
| CN | 213484300 | U | 6/2021 |
| CN | 213920679 | U | 8/2021 |
| CN | 213973883 | U | 8/2021 |
| CN | 113471600 | A | 10/2021 |
| CN | 214337127 | U | 10/2021 |
| CN | 214958134 | U | 11/2021 |
| CN | 113765013 | A | 12/2021 |
| JP | 2010-130768 | A | 6/2010 |
| JP | 2012213313 | A | 11/2012 |
| JP | 2018-063922 | A | 4/2018 |
| KR | 20120061071 | A | 6/2012 |
| KR | 10-2020-0119729 | A | 10/2020 |
| WO | 2015097534 | A1 | 7/2015 |
| WO | 2018/047752 | A1 | 3/2018 |

OTHER PUBLICATIONS

English machine translation of CN108075062A published May 25, 2018. (Year: 2018).*
International Preliminary Report on Patentability Chapter I for International Application No. PCT/CN2022/132834 mailed on Jul. 4, 2024.
International Preliminary Report on Patentability Chapter I for International Application No. PCT/CN2022/132874 mailed on Jul. 4, 2024.
Extended European Search Report for European Application No. 22909614.4 mailed on Jan. 21, 2025.
Notice of acceptance for Australian Application No. 2022422952 mailed on Aug. 18, 2025.
Request for the submission of an opinion for Korean Application No. 10-2024-7008163 mailed on Jul. 31, 2025.
Request for the submission of an opinion for Korean Application No. 10-2024-7009602 mailed on Aug. 8, 2025.
Notice of Reasons for Refusal for Japanese Application No. 2024-515859 mailed on Jul. 8, 2025.
Office Action for Canadian Application No. 3233292 mailed on Mar. 20, 2025.
First Office Action for Chinese Application No. 202210182971.7 mailed on Jul. 24, 2024.
Second Office Action for Chinese Application No. 202210182971.7 mailed on Oct. 1, 2024.
Notification to Grant for Chinese Application No. 202210182971.7 mailed on Dec. 1, 2024.
International Search Report and Written Opinion for Application No. PCT/CN2022/132874, mailed on Feb. 7, 2023.
International Search Report and Written Opinion for Application No. PCT/CN2022/132834, mailed on Jan. 28, 2023, 9 pages.
Extended European Search Report dated Jan. 28, 2025, issued in related European Patent Application No. 22909609.4 (24 pages).
Examination Report No. 1 dated Oct. 8, 2024, issued in related Australian Patent Application No. 2022422952 (4 pages).
Examination Report No. 1 dated Mar. 6, 2025, issued in related Australian Patent Application No. 2022422953 (4 pages).
Notice of Reasons for Refusal dated Jul. 1, 2025, issued in related Japanese Patent Application No. 2024-515842, with English machine translation (6 pages).

* cited by examiner

POWER DISTRIBUTION APPARATUS, BATTERY PACK, AND VEHICLE

CROSS-REFERENCE TO RELATED APPLICATIONS

The application is a continuation application of International Patent Application No. PCT/CN2022/132834 filed on Nov. 18, 2022, which is based on and claims priority to and benefits of Chinese Patent Application No. 202123233795.5 filed on Dec. 20, 2021, and Chinese Patent Application No. 202210182099.6 filed on Feb. 25, 2022. The entire content of all of the above-referenced applications is incorporated herein by reference.

FIELD

The present disclosure relates to the technical field of vehicles, and more particularly, to a power distribution apparatus, a battery pack, and a vehicle.

BACKGROUND

A power distribution apparatus in related art usually includes a high-voltage circuit, a low-voltage circuit, a high-voltage connector and a low-voltage connector. In addition, there are many copper bars or wire harnesses between the components in the power distribution apparatus, resulting in a chaotic layout, occupying a large space, low space utilization, high costs, a heavy weight, a large volume, and low production efficiency.

SUMMARY

The present disclosure resolves at least one of the technical problems in the related art. The present disclosure provides a power distribution apparatus that has advantages such as a simple and compact structure, high space utilization, a small size, a light weight, and low costs.

The present disclosure further provides a battery pack having the above power distribution apparatus.

The present disclosure further provides a vehicle having the above battery pack.

An embodiment of a first aspect of the present disclosure provides a power distribution apparatus, which includes: a base, a high-voltage connection part and a low-voltage connection part being fixed on the base, a high-voltage loop, a circuit board disposed on the base, a low-voltage loop integrated into the circuit board and electrically connected to the low-voltage connection part, and tabs. At least a portion of the high-voltage loop is disposed on the base. The high-voltage loop is electrically connected to the high-voltage connection part, has a positive-electrode connection end and a negative-electrode connection end, and includes a disconnecting switch core fixed on the base. A first end of each of the tabs is electrically connected to the high-voltage loop, and a second end of each of the tabs is plugged into the circuit board for electrical connection with the low-voltage loop.

According to some embodiments of the present disclosure, the plurality of tabs are parallel to each other and perpendicular to the circuit board.

According to some embodiments of the present disclosure, the high-voltage loop is electrically connected with the high-voltage connection part, the low-voltage connection part is plugged into the circuit board for electrical connection with the low-voltage loop, and components connected in the high-voltage loop are electrically connected with each other.

According to some embodiments of the present disclosure, the high-voltage loop further includes a circuit protector, the circuit protector is disposed on the base, and a first terminal of the circuit protector forms the positive-electrode connection end. The disconnecting switch core includes a plurality of disconnecting switch cores, the plurality of disconnecting switch cores include at least a positive disconnecting switch core and a negative disconnecting switch core, a second terminal of the circuit protector is electrically connected to a first terminal of the positive disconnecting switch core, and a second terminal of the positive disconnecting switch core and a first terminal of the negative disconnecting switch core are electrically connected to the high-voltage connection part; and the plurality of tabs include a positive low-voltage positive-electrode tab, a positive low-voltage negative-electrode tab, a negative low-voltage positive-electrode tab, and a negative low-voltage negative-electrode tab, a first end of the positive low-voltage positive-electrode tab and a first end of the positive low-voltage negative-electrode tab are respectively connected to the positive disconnecting switch core, a second end of the positive low-voltage positive-electrode tab and a second end of the positive low-voltage negative-electrode tab are respectively plugged into the circuit board and are electrically connected to the low-voltage loop, a first end of the negative low-voltage positive-electrode tab and a first end of the negative low-voltage negative-electrode tab are respectively connected to the negative disconnecting switch core, and a second end of the negative low-voltage positive-electrode tab and a second end of the negative low-voltage negative-electrode tab are plugged into the circuit board for electrical connection with the low-voltage loop.

According to some embodiments of the present disclosure, the second terminal of the circuit protector is electrically connected with the first terminal of the positive disconnecting switch core. The second terminal of the positive disconnecting switch core and the first terminal of the negative disconnecting switch core are electrically connected with the high-voltage connection part.

According to some embodiments of the present disclosure, the plurality of tabs further include: a positive-electrode voltage collection piece, a first end of the positive-electrode voltage collection piece being connected between the second terminal of the positive disconnecting switch core and the high-voltage connection part, and a second end of the positive-electrode voltage collection piece being plugged into the circuit board and being electrically connected to the low-voltage loop; and a negative-electrode voltage collection piece, a first end of the negative-electrode voltage collection piece being connected between the first terminal of the negative disconnecting switch core and the high-voltage connection part, and a second end of the negative-electrode voltage collection piece being plugged into the circuit board and being electrically connected to the low-voltage loop.

According to some embodiments of the present disclosure, the high-voltage connection part includes: a high-voltage positive-electrode lead-out piece, the high-voltage positive-electrode lead-out piece electrically connected with the second terminal of the positive disconnecting switch core and an end of the positive-electrode voltage collection piece; and a high-voltage negative-electrode lead-out piece, the high-voltage negative-electrode lead-out piece electrically connected with the first terminal of the negative disconnecting switch core and an end of the negative-electrode voltage collection piece.

According to some embodiments of the present disclosure, the second terminal of the positive disconnecting switch core, the high-voltage positive-electrode lead-out piece, and the end of the positive-electrode voltage collection piece are in contact with each other, one of the high-voltage positive-electrode lead-out piece and the positive-electrode voltage collection piece comprises a positive-electrode anti-rotation positioning groove, and the other one of the high-voltage positive-electrode lead-out piece and the positive-electrode voltage collection piece mates with the positive-electrode anti-rotation positioning groove; and the first terminal of the negative disconnecting switch core, the high-voltage negative-electrode lead-out piece, and the end of the negative-electrode voltage collection piece are in contact with each other, one of the high-voltage negative-electrode lead-out piece and the negative-electrode voltage collection piece comprises a negative-electrode anti-rotation positioning groove, and the other one of the high-voltage negative-electrode lead-out piece and the negative-electrode voltage collection piece mates with the negative-electrode anti-rotation positioning groove.

According to some embodiments of the present disclosure, the base includes a first positioning separation rib and a second positioning separation rib, the first positioning separation rib is located between the circuit protector and the high-voltage positive-electrode lead-out piece, and is located between the circuit protector and the positive-electrode voltage collection piece; and the second positioning separation rib is located between the high-voltage positive-electrode lead-out piece and the high-voltage negative-electrode lead-out piece, and is located between the positive-electrode voltage collection piece and the negative-electrode voltage collection piece.

According to some embodiments of the present disclosure, the high-voltage loop further includes a current sensor, a first terminal of the current sensor forms negative-electrode connection end, and a second terminal of the current sensor is electrically connected to the second terminal of the negative disconnecting switch core; and the plurality of tabs further include a current collection pin, a first end of the current collection pin is connected to the current sensor, and a second end of the current collection pin is plugged into the circuit board and is electrically connected to the low-voltage loop.

According to some embodiments of the present disclosure, the second terminal of the current sensor is electrically connected with the second terminal of the negative disconnecting switch core.

According to some embodiments of the present disclosure, the base is configured with a third positioning separation rib, and the third positioning separation rib is located between the current sensor and the high-voltage connection part.

According to some embodiments of the present disclosure, the circuit protector, the positive disconnecting switch core, the negative disconnecting switch core and the current sensor are disposed along a length direction of the base; and the low-voltage connection part and the current sensor are disposed along a width direction of the base.

According to some embodiments of the present disclosure, the high-voltage loop further includes a precharge loop, a portion of the precharge loop is integrated into the circuit board, the precharge loop includes a precharge resistor and a precharge disconnecting switch, the precharge resistor and the precharge disconnecting switch are disposed on the base and plugged into the circuit board, and the precharge resistor and the precharge disconnecting switch are connected in series to each other and in parallel with the disconnecting switch core; and the plurality of tabs further include a precharge low-voltage positive-electrode tab and a precharge low-voltage negative-electrode tab, a first end of the precharge low-voltage positive-electrode tab and a first end of the precharge low-voltage negative-electrode tab are connected to the precharge disconnecting switch, and a second end of the precharge low-voltage positive-electrode tab and a second end of the precharge low-voltage negative-electrode tab are plugged into the circuit board for electrical connection with the low-voltage loop.

According to some embodiments of the present disclosure, the precharge disconnecting switch has a precharge high-voltage positive-electrode tab and a precharge high-voltage negative-electrode tab, the precharge resistor has a resistor high-voltage tab, the precharge disconnecting switch and the precharge resistor are electrically connected to each other, and the precharge high-voltage positive-electrode tab, the precharge high-voltage negative-electrode tab, and the resistor high-voltage tab are plugged into the circuit board and in electrical connection with a portion of the precharge loop integrated on the circuit board. In an embodiment, the precharge disconnecting switch has the precharge high-voltage positive-electrode tab and the precharge high-voltage negative-electrode tab, the precharge resistor has a resistor high-voltage positive-electrode tab and a resistor high-voltage negative-electrode tab, and the precharge high-voltage positive-electrode tab, the precharge high-voltage negative-electrode tab, the resistor high-voltage positive-electrode tab, and the resistor high-voltage negative-electrode tab are plugged into the circuit board and in electrical connection with a portion of the precharge loop integrated on the circuit board.

According to some embodiments of the present disclosure, the precharge loop further includes: a precharge tab, the second terminal of the circuit protector electrically connected with the first terminal of the positive disconnecting switch core, a first end of the precharge tab being connected at an contacting position between the second terminal of the circuit protector and the first terminal of the positive disconnecting switch core, and a second end of the precharge tab being plugged into the circuit board and electrically connected to a portion of the precharge loop integrated on the circuit board.

According to some embodiments of the present disclosure, the precharge tab is integrally formed with the second terminal of the circuit protector.

According to some embodiments of the present disclosure, the precharge disconnecting switch, the precharge resistor, the positive disconnecting switch core, the negative disconnecting switch core, and the low-voltage connection part are disposed along the length direction of the base; and the precharge disconnecting switch, the precharge resistor and the circuit protector are disposed along the width direction of the base.

According to some embodiments of the present disclosure, the base includes a positive disconnecting switch core installation groove, a negative disconnecting switch core installation groove, a precharge disconnecting switch installation groove, and a precharge resistor installation groove; the positive disconnecting switch core is fixed to the positive disconnecting switch core installation groove through, for example, thermal conductive potting of smidahk; the negative disconnecting switch core is fixed to the negative disconnecting switch core installation groove through, for example, thermal conductive potting of smidahk; the precharge disconnecting switch is clamped in the precharge disconnecting switch installation groove or fixed to the precharge disconnecting switch installation groove through, for example, thermal conductive potting of smidahk; and the precharge resistor is clamped in the precharge resistor installation groove.

According to some embodiments of the present disclosure, the base includes: a base body, at least a portion of the high-voltage loop being arranged on the base body, and the circuit board being disposed on the base body; and a panel, the panel being connected to the base body, and the high-voltage connection part and the low-voltage connection part being fixed on the panel.

According to some embodiments of the present disclosure, the base body and the panel are one piece or separate pieces.

An embodiment of a second aspect of the present disclosure provides a battery pack, including: a housing; the power distribution apparatus according to the embodiments of the first aspect of the present disclosure, the power distribution apparatus being disposed in the housing, and the high-voltage connection part and the low-voltage connection part being exposed from the housing; and a battery module, the battery module being located in the housing and electrically connected to the positive-electrode connection end and the negative-electrode connection end.

An embodiment of a third aspect of the present disclosure provides a vehicle, including the battery pack according to the embodiments of the second aspect of the present disclosure.

The additional aspects and advantages of the present disclosure will be provided in the following description, some of which will become apparent from the following description or may be learned from practices of the present disclosure.

BRIEF DESCRIPTION OF THE DRAWINGS

The foregoing and/or additional aspects and advantages of the present disclosure will become apparent and comprehensible from the following descriptions of the embodiments with reference to the accompanying drawings, where.

DESCRIPTIONS OF REFERENCE NUMERALS

Figure 1:
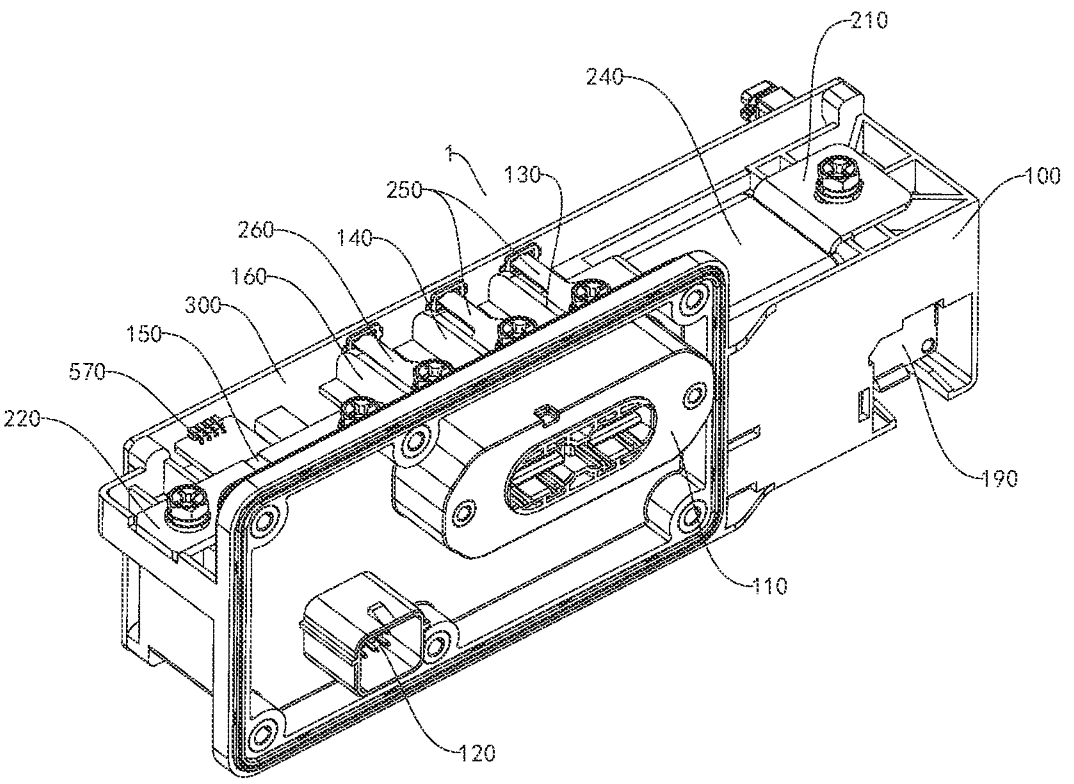
FIG. 1 is a schematic structural diagram of a power distribution apparatus according to an embodiment of the present disclosure.

1—power distribution apparatus, 2—battery pack, 3—vehicle, 100—base, 101—positive disconnecting switch core installation groove, 102—negative disconnecting switch core installation groove, 103—precharge disconnecting switch installation groove, 104—precharge resistor installation groove, 105—base, 106—panel, 110—high-voltage connection part, 111—high-voltage positive-electrode lead-out piece, 112—high-voltage negative-electrode lead-out piece, 120—low-voltage connection part, 130—first positioning separation rib, 140—second positioning separation rib, 150—current sensor, 160—third positioning separation rib, 170—precharge loop, 171—precharge tab, 180—precharge resistor, 181—resistor high-voltage tab, 182—resistor high-voltage positive-electrode tab, 183—resistor high-voltage negative-electrode tab, 190—precharge disconnecting switch, 191—precharge high-voltage positive-electrode tab, 192—precharge high-voltage negative-electrode tab, 200—high-voltage loop, 210—positive-electrode connection end, 220—negative-electrode connection end, 230—disconnecting switch core, 231—positive disconnecting switch core, 232—negative disconnecting switch core, 240—circuit protector, 300—circuit board, 400—low-voltage loop, 500—tab, 510—positive low-voltage positive-electrode tab, 520—positive low-voltage negative-electrode tab, 530—negative low-voltage positive-electrode tab, 540—negative low-voltage negative-electrode tab, 550—positive-electrode voltage collection piece, 560—negative-electrode voltage collection piece, 570—current collection pin, 580—precharge low-voltage positive-electrode tab, 590—precharge low-voltage negative-electrode tab, 700—battery module, 800—housing, and 900—load.

DETAILED DESCRIPTION

Embodiments of the present disclosure will be described below in detail, and examples of the embodiments are shown in the drawings, where the same or similar reference numerals throughout the drawings represent the same or similar elements or the elements having the same or similar functions. The embodiments described below with reference to the accompanying drawings are examples, and are merely to explain the present disclosure and cannot be construed as a limitation to the present disclosure.

In the description of the present disclosure, it needs to be understood that the directions or positional relationships indicated by terms such as "center", "longitudinal", "horizontal", "length", "width", "thickness", "upper", "lower", "front", "rear", "left", "right", "vertical", "horizontal", "top", "bottom", "inside", "outside", "clockwise", "counter-clockwise", "axial", "radial", and "circumferential" are based on those shown in the accompanying drawings, and are only to facilitate the description of the present disclosure and simplify the description, and do not indicate or imply that the apparatus or component must have an orientation, be constructed and operated in an orientation, and therefore cannot be understood as limiting the present disclosure.

In the description of the present disclosure, "multiple" or "a plurality of" means two or more than two, and "several" means one or more.

A battery pack 2 according to the embodiments of the present disclosure is described below with reference to the accompanying drawings. The battery pack 2 includes a housing 800, a battery module 700, and a power distribution apparatus 1.

The power distribution apparatus 1 according to the embodiments of the present disclosure is first described with reference to the accompanying drawings.

As shown in FIG. 1 to FIG. 8, the power distribution apparatus 1 according to the embodiments of the present disclosure includes a base 100, a high-voltage loop 200, a circuit board 300, a low-voltage loop 400, and a plurality of tabs 500.

A high-voltage connection part 110 and a low-voltage connection part 120 are fixed on the base 100. At least a portion of the high-voltage loop 200 is arranged/disposed on the base 100, the high-voltage loop 200 is electrically connected to the high-voltage connection part 110, the high-voltage loop 200 has a positive-electrode connection end 210 and a negative-electrode connection end 220, and the high-voltage loop 200 includes a disconnecting switch core 230 fixed on the base 100; the circuit board 300 is arranged/disposed on the base 100; and the low-voltage loop 400 is integrated into the circuit board 300 and is electrically connected to the low-voltage connection part 120. A first end of each tab 500 is connected to the high-voltage loop 200 for electrical connection, and a second end of the tab is plugged into the circuit board 300 for electrical connection with the low-voltage loop 400.

It should be noted that for the term "disconnecting switch core 230", a disconnecting switch may include but is not limited to one or more of a relay, an IGBT (Insulated Gate Bipolar Transistor, Insulated Gate Bipolar Transistor), and a MOS field-effect transistor (Metal-Oxide-Semiconductor Field-Effect Transistor, MOSFET). "Core" refers to a portion of the disconnecting switch that mainly implements its function, and can be understood as the internal functional component of the disconnecting switch after removing its housing, that is, the disconnecting switch core 230 may be the remaining part after removing the housing of the disconnecting switch. In addition, the circuit board 300 can be integrated with a battery management controller (Battery Management Controller, BMC).

In the battery pack 2 of the embodiments of the present disclosure, the power distribution apparatus 1 is provided in the housing, the high-voltage connection part 110 and the low-voltage connection part 120 are exposed from the housing, and the battery module 700 is located in the housing and is electrically connected to the positive-electrode connection end 210 and the negative-electrode connection end 220. The high-voltage connection part 110 and the low-voltage connection part 120 are exposed from the housing to connect to electrical components of the vehicle (for example, a motor, an air conditioning compressor, a PTC (Positive Temperature Coefficient), or a controller).

For example, the high-voltage loop 200 and the low-voltage loop 400 are not directly connected to each other, and instead a transformer structure (that is, a structure that can change the voltage) is connected between the high-voltage loop 200 and the low-voltage loop 400, for example, a transformer is connected between the high-voltage loop 200 and the low-voltage loop 400. The setting of the transformer structure can ensure that the voltage of the current in the low-voltage loop 400 is lower than the voltage of the current in the high-voltage loop 200, and the battery module 700 can supply power to the low-voltage loop 400 through the high-voltage loop 200 and the transformer structure, to achieve normal operation of the low-voltage loop 400.

According to the power distribution apparatus 1 of the embodiments of the present disclosure, the high-voltage connection part 110 and the low-voltage connection part 120 are fixed on the base 100, and the high-voltage connection part 110 and the low-voltage connection part 120 may be exposed from the housing. The high-voltage connection part 110 can supply power to high-voltage electrical devices of the vehicle. The low-voltage connection part 120 can include a communication pin for communicating with a controller of the vehicle to achieve real-time control over the power distribution apparatus 1, and the low-voltage connection part 120 may also include a low-voltage plug for supplying power to low-voltage electrical devices of the vehicle. Furthermore, the base 100 can fix positions of the high-voltage connection part 110 and the low-voltage connection part 120 relative to the base 100, to avoid the contact between the high-voltage connection part 110 and the low-voltage connection part 120 to ensure the safety of the electrical connection of the power distribution apparatus 1. The high-voltage connection part 110, the low-voltage connection part 120 and the base 100 can be designed separately to enhance connection flexibility. The battery module 700 can supply power to the high-voltage loop 200 through the positive-electrode connection end 210 and the negative-electrode connection end 220, and the high-voltage loop 200 can supply power to high-voltage electrical devices of the vehicle through the high-voltage connection part 110.

Moreover, the base 100 is configured to directly fix the disconnecting switch core 230. The disconnecting switch core 230 can have a sufficiently long lead-out part while space is saved. The disconnecting switch core 230 is directly used and the base 100 is configured to fix and protect the disconnecting switch core 230, thus eliminating the original housing of the existing disconnecting switch and making the structure simple and more compact.

The low-voltage loop 400 is integrated into the circuit board 300, the circuit board 300 is arranged on the base 100, and the disconnecting switch core 230 can have a sufficiently long lead-out part, creating a prerequisite for eliminating a large number of copper bars and wire harnesses inside the power distribution apparatus 1. On this basis, the tab 500 is arranged, a first end of each tab 500 is connected to the high-voltage loop 200 for electrical connection, and a second end of the tab is plugged into the circuit board 300 for electrical connection with the low-voltage loop 400.

In other words, the first end of each tab 500 can be connected to the high-voltage loop 200, and the second end of each tab 500 can be directly plugged into the circuit board 300, thereby implementing the connection between the high-voltage loop 200 and the low-voltage loop 400. The low-voltage loop 400 on the circuit board 300 can control the connection and disconnection of the disconnecting switch core 230, which can eliminate the need for existing intermediate connectors (for example, copper bars and wire harnesses) for high and low voltage connections.

As can be seen from above, the electrical connection between the high-voltage loop 200 and the low-voltage loop 400 is more reliable, the layout is clear, and it is not prone to problems such as excessive temperature rise or sintering at the connection point. By eliminating a large number of copper bars and wire harnesses in the existing power distribution apparatus 1, the layout of electrical connections in the power distribution apparatus 1 can be further simplified and the structure is simple and compact, thereby further reducing the volume of the power distribution apparatus 1, improving the space utilization of the power distribution apparatus 1, and reducing the weight and costs of the power distribution apparatus 1, so as to further save the space of the battery pack 2, improve the energy density of the battery pack 2 and improve the battery endurance of the entire vehicle.

In this way, the power distribution apparatus 1 in the embodiments of the present disclosure has advantages such as a simple and compact structure, high space utilization, a small volume, a light weight, and low costs.

In the battery pack 2 according to the embodiments of the present disclosure, the power distribution apparatus 1 in the embodiments of the present disclosure is used, which has advantages such as a simple and compact structure, high space utilization, a small size, a light weight, and low costs.

According to some embodiments of the present disclosure, as shown in FIG. 1 to FIG. 4, a plurality of tabs 500 are parallel to each other and perpendicular to the circuit board 300. A region where the high-voltage loop 200 is arranged is generally parallel to the circuit board 300, and each tab 500 is arranged perpendicular to the circuit board 300. On the one hand, the size of the tab 500 between the high-voltage loop 200 and the circuit board 300 can be reduced, and the volume of the tab 500 can be reduced. On the other hand, this can avoid interference between a plurality of tabs 500, reduce the difficulty of circuit connection, and further simplify the layout.

Figure 2:
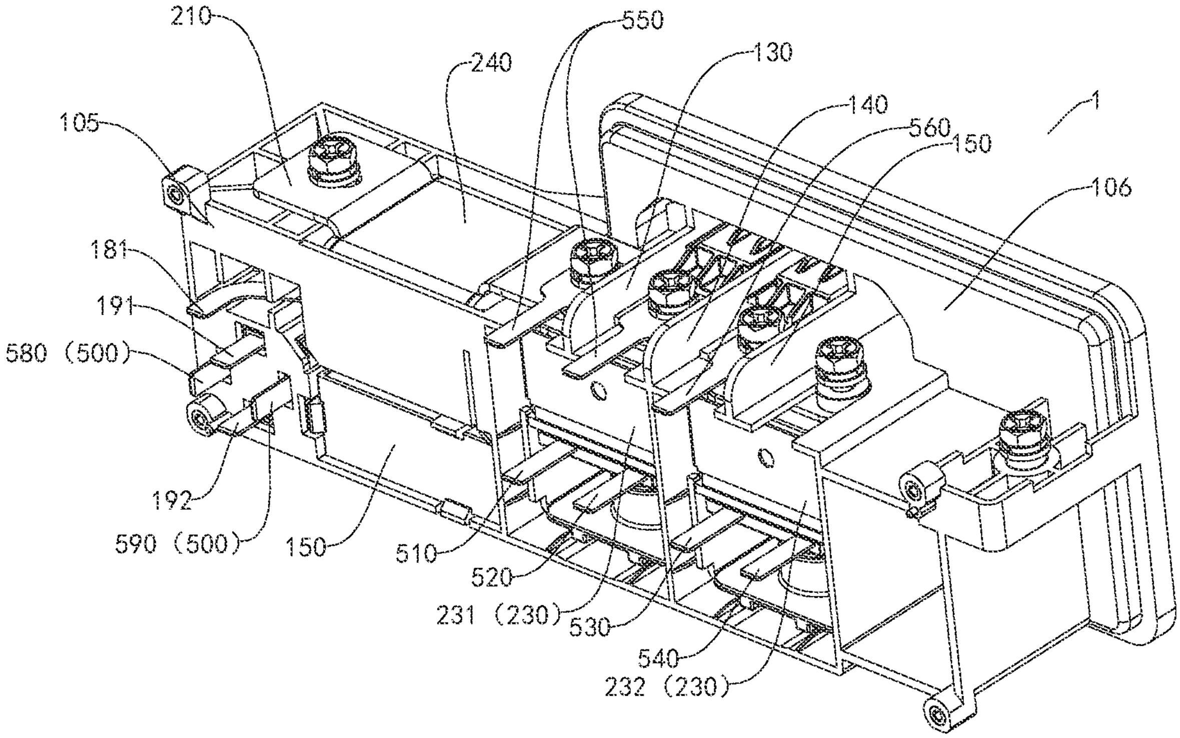
FIG. 2 is a schematic structural diagram of another perspective of a power distribution apparatus according to an embodiment of the present disclosure.
Figure 3:
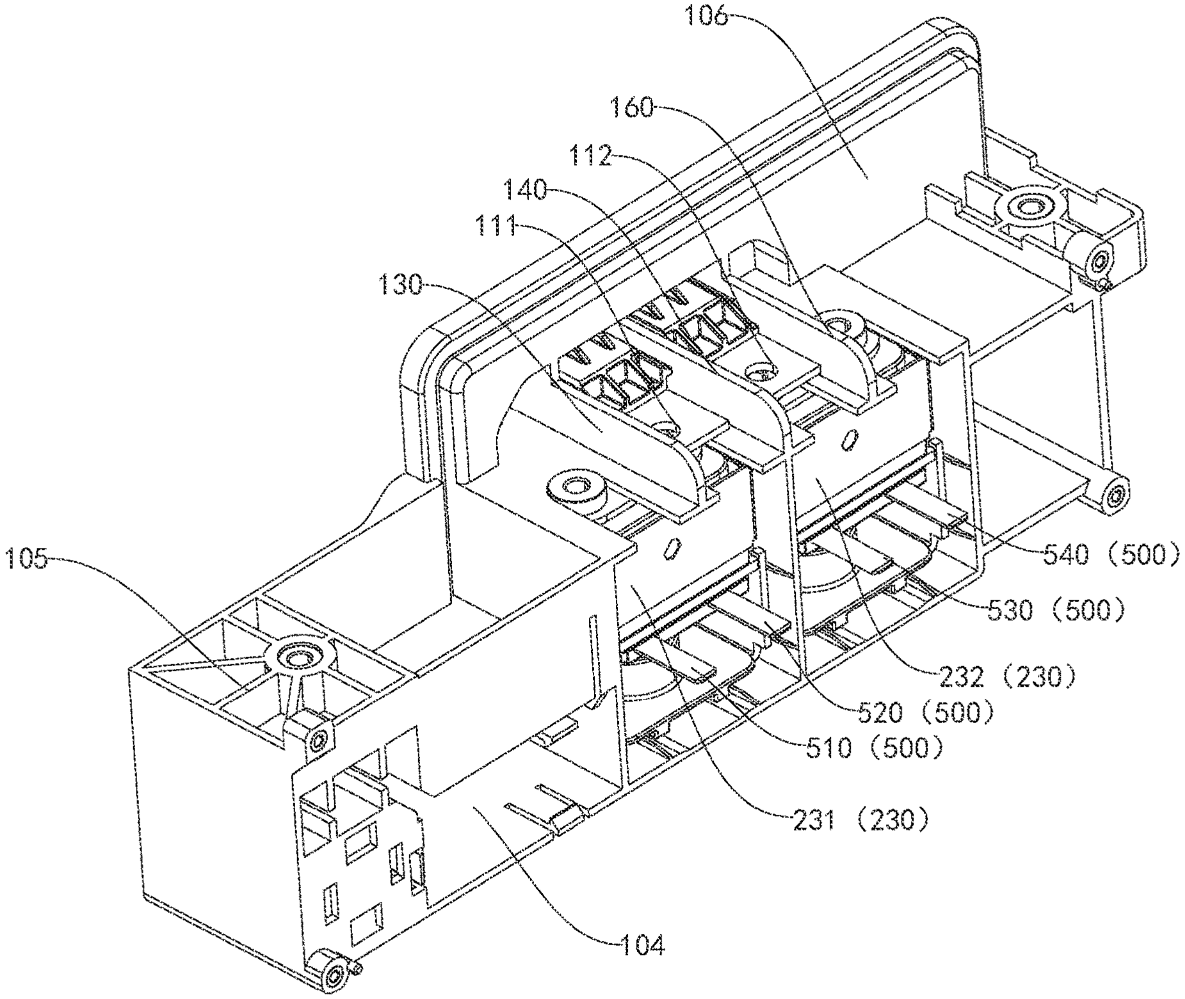
FIG. 3 is a schematic structural diagram of a power distribution apparatus according to another embodiment of the present disclosure.
Figure 4:
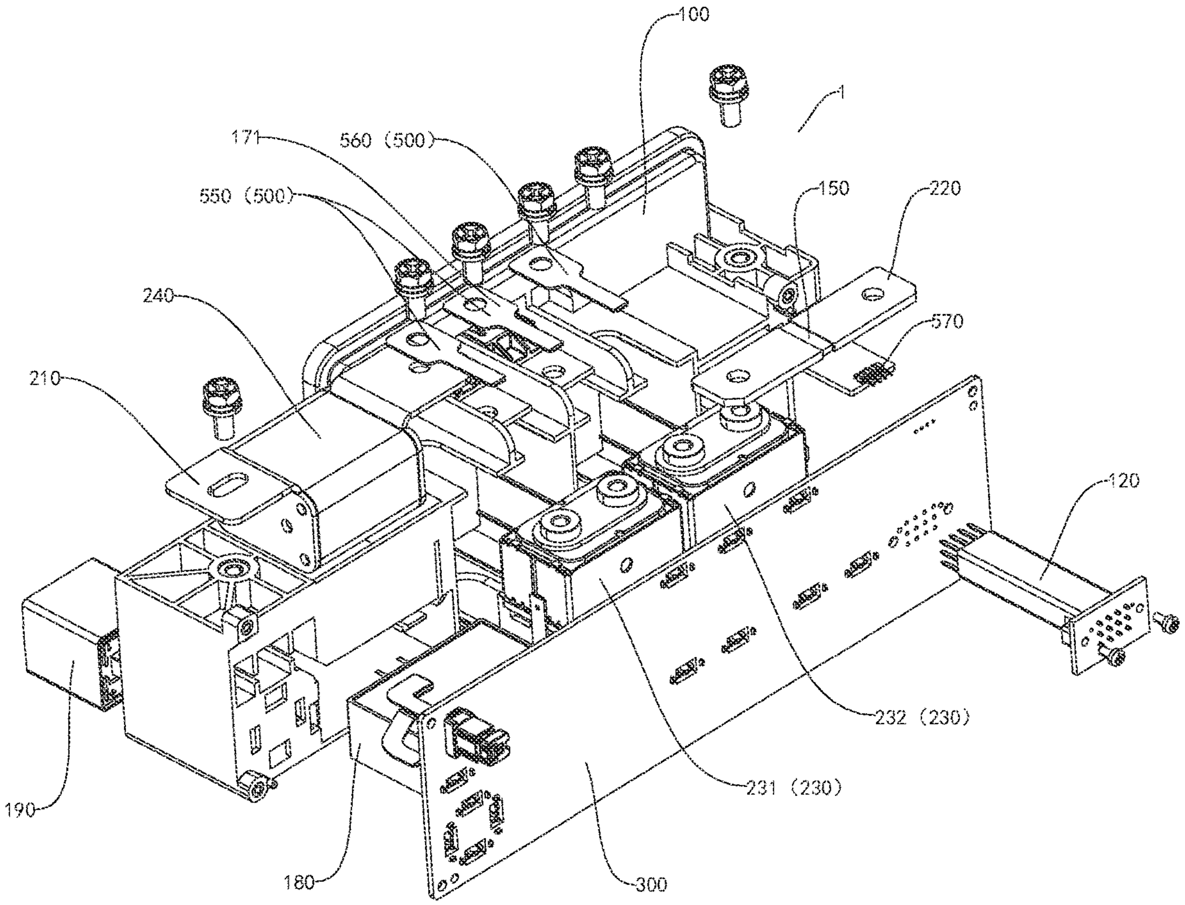
FIG. 4 is an exploded view of a power distribution apparatus according to an embodiment of the present disclosure.

According to some embodiments of the present disclosure, as shown in FIG. 2 to FIG. 4, the high-voltage loop 200 is in contact with the high-voltage connection part 110 for electrical connection. Since the disconnecting switch core 230 may have a sufficiently long lead-out part, connecting can be implemented between the high-voltage loop 200 and the high-voltage connection part 110 through partial superimposing. Electrical connection is achieved through this contacting, thus eliminating the existing intermediate connector between the high-voltage loop and the high-voltage connection part, that is, copper bars and wire harnesses in the high-voltage part.

In addition, the low-voltage connecting part 120 is plugged into the circuit board 300 for electrical connection with the low-voltage loop 400. That is, the low-voltage loop 400 and the low-voltage connecting part 120 can be electrically connected through the circuit board 300, thus eliminating the existing intermediate connector between the low-voltage loop and the low-voltage connection part, such as copper bars and wire harnesses in the low-voltage part. Moreover, components connected in the high-voltage loop 200 can be electrically connected through contacting, that is, contacting can be implemented through partial superimposing between the components that need to be connected in the high-voltage loop 200. Electrical connection is achieved through this contacting, thus eliminating the existing intermediate connector in the high-voltage loop, that is, copper bars and wire harnesses in the high-voltage part.

As can be seen from above, the electrical connections between the high-voltage loop 200 and the high-voltage connection part 110, between components connected in the high-voltage loop 200, and between the low-voltage loop 400 and the low-voltage connection part 120 are more reliable, the layout is clear, and it is not prone to problems such as excessive temperature rise or sintering at the connection point. By eliminating a large number of copper bars and wire harnesses in the existing power distribution apparatus 1, the layout of electrical connections in the power distribution apparatus 1 can be further simplified, thereby further reducing the volume of the power distribution apparatus 1, improving the space utilization of the power distribution apparatus 1, and reducing the weight and costs of the power distribution apparatus 1, so as to further save the space of the battery pack 2, improve the energy density of the battery pack 2 and improve the battery endurance of the entire vehicle.

According to some embodiments of the present disclosure, as shown in FIG. 1, FIG. 2, and FIG. 4, the high-voltage loop 200 further includes a circuit protector 240, the circuit protector 240 is arranged on the base 100, and a first terminal of the circuit protector 240 forms a positive-electrode connection end 210. The circuit protector 240 may include but is not limited to one or more loop protection devices such as fuses, circuit breakers, fuses, and active fuses. By setting the circuit protector 240, when the high-voltage loop 200 has an excessive current or voltage, the circuit protector 240 can automatically disconnect to cut off the high-voltage loop 200 in time, thereby protecting other components in the high-voltage loop 200.

In addition, there are a plurality of disconnecting switch cores 230, and the plurality of disconnecting switch cores include at least a positive disconnecting switch core 231 and a negative disconnecting switch core 232. A second terminal of the circuit protector 240 is electrically connected to a first terminal of the positive disconnecting switch core 231, and a second terminal of the positive disconnecting switch core 231 and a first terminal of the negative disconnecting switch core 232 are electrically connected to the high-voltage connection part 110.

The positive disconnecting switch core 231 can include but is not limited to one or more of a core of a relay (that is, the relay does not need to be equipped with a housing), a core of an IGBT (that is, the IGBT does not need to be equipped with a housing), and a core of a MOS transistor (that is, the MOS transistor does not need to be equipped with a housing), and the negative disconnecting switch core 232 can include but is not limited to one or more of a core of a relay (that is, the relay does not need to be equipped with a housing), a core of an IGBT (that is, the IGBT does not need to be equipped with a housing), and a core of a MOS transistor (that is, the MOS transistor do not need to be equipped with a housing).

It should be noted that the circuit board 300 is integrated with the low-voltage loop 400, so that connection and disconnection of the positive disconnecting switch core 231 and connection and disconnection of the negative disconnecting switch core 232 can be controlled.

For example, the positive disconnecting switch core 231 can control whether the high-voltage connection part 110 and the positive-electrode connection end 210 are connected, and the negative disconnecting switch core 232 can control whether the high-voltage connection part 110 and the negative-electrode connection end 220 are connected. When both the positive disconnecting switch core 231 and the negative disconnecting switch core 232 remain connected, the electrical conduction of the high-voltage loop 200 can be achieved. In this case, the battery module 700 can supply power to high-voltage electrical devices of the vehicle through the high-voltage connection part 110. Since the voltage of the current in the high-voltage loop 200 is relatively high, the positive disconnecting switch core 231 and the negative disconnecting switch core 232 are arranged, and connection and disconnection of the positive disconnecting switch core 231 and the negative disconnecting switch core 232 do not interfere with each other, so that the high-voltage loop 200 can be disconnected very reliably, to improve the safety of the high-voltage loop 200, thereby ensuring the safety of power supply to high-voltage electrical devices of the vehicle.

In addition, the plurality of tabs 500 include a positive low-voltage positive-electrode tab 510, a positive low-voltage negative-electrode tab 520, a negative low-voltage positive-electrode tab 530, and a negative low-voltage negative-electrode tab 540. A first end of the positive low-voltage positive-electrode tab 510 and a first end of the positive low-voltage negative-electrode tab 520 are connected to the positive disconnecting switch core 231, a second end of the positive low-voltage positive-electrode tab 510 and a second end of the positive low-voltage negative-electrode tab 520 are plugged into the circuit board 300 and are electrically connected to the low-voltage loop 400. A first end of the negative low-voltage positive-electrode tab 530 and a first end of the negative low-voltage negative-electrode tab 540 are connected to the negative disconnecting switch core 232, and a second end of the negative low-voltage positive-electrode tab 530 and a second end of the negative low-voltage negative-electrode tab 540 are plugged into the circuit board 300 for electrical connection with the low-voltage loop 400.

In this way, the positive disconnecting switch core 231 achieves the electrical connection with the low-voltage loop 400 on the circuit board 300 through the positive low-voltage positive-electrode tab 510 and the positive low-voltage negative-electrode tab 520, and the negative disconnecting switch core 232 achieves the electrical connection with the low-voltage loop 400 on the circuit board 300 through the negative low-voltage positive-electrode tab 530 and the negative low-voltage negative-electrode tab 540, so that the low-voltage loop 400 on the circuit board 300 can be used to control connection and disconnection of the positive disconnecting switch core 231 and connection and disconnection of the negative disconnecting switch core 232.

Moreover, the positive disconnecting switch core 231 is directly connected to the circuit board 300 by plugging through the positive low-voltage positive-electrode tab 510 and the positive low-voltage negative-electrode tab 520, which can eliminate a conductive structure (for example, a conductive copper bar or wire) between the positive disconnecting switch core 231 and the circuit board 300, to ensure a reliable electrical connection between the positive disconnecting switch core 231 and the circuit board 300, and help to reduce the volume, costs and weight of the power distribution apparatus 1. Meanwhile, the negative disconnecting switch core 232 is directly connected to the circuit board 300 by plugging through the negative low-voltage positive-electrode tab 530 and the negative low-voltage negative-electrode tab 540, which can eliminate a conductive structure (for example, a conductive copper bar or wire) between the negative disconnecting switch core 232 and the circuit board 300, to ensure a reliable electrical connection between the negative disconnecting switch core 232 and the circuit board 300, and help to reduce the volume, costs and weight of the power distribution apparatus 1.

In an embodiment, as shown in FIG. 1, FIG. 2 and FIG. 4, a second terminal of the circuit protector 240 is electrically connected to a first terminal of the positive disconnecting switch core 231 through contacting, and a second terminal of the positive disconnecting switch core 231 and a first terminal of the negative disconnecting switch core 232 are electrically connected to the high-voltage connection part 110 through contacting.

In this way, there is no need to arrange a conductive structure (for example, a conductive copper bar) between the circuit protector 240 and the disconnecting switch core 230, and the power distribution apparatus 1 has higher space utilization, and therefore has a smaller size, a lighter weight and lower costs. Therefore, it is conducive to improving reliability of the electrical connection between the circuit protector 240 and the disconnecting switch core 230, and it is not prone to problems such as excessive temperature rise and sintering at the connection point. There is no need to arrange a conductive structure (for example, a conductive copper bar or wire) between the positive disconnecting switch core 231 and the high-voltage connection part 110 and between the negative disconnecting switch core 232 and the high-voltage connection part. This simplifies the electrical connection structure of the positive disconnecting switch core 231 and the negative disconnecting switch core 232, the electrical connection is reliable, the layout is simple, and it is not prone to problems such as excessive temperature rise or sintering at the connection point.

Further, as shown in FIG. 1, FIG. 2, and FIG. 4, the plurality of tabs 500 further include a positive-electrode voltage collection piece 550 and a negative-electrode voltage collection piece 560. A first end of the positive-electrode voltage collection piece 550 is in contact at a contacting position between the second terminal of the positive disconnecting switch core 231 and the high-voltage connection part 110, and a second end of the positive-electrode voltage collection piece 550 is plugged into the circuit board 300 and is electrically connected to the low-voltage loop 400. A first end of the negative-electrode voltage collection piece 560 is in contact at a contacting position between the first terminal of the negative disconnecting switch core 232 and the high-voltage connection part 110, and a second end of the negative-electrode voltage collection piece 560 is plugged into the circuit board 300 and is electrically connected to the low-voltage loop 400.

In this way, the circuit board 300 can collect the voltage of the high-voltage loop 200 through the positive-electrode voltage collection piece 550 and the negative-electrode voltage collection piece 560, to monitor the voltage of the high-voltage loop 200 and whether sintering occurs, which is conducive to the reliable application of the power distribution apparatus 1 and improves the safety of the power distribution apparatus 1.

Furthermore, as shown in FIG. 3 to FIG. 6, the high-voltage connection part 110 includes a high-voltage positive-electrode lead-out piece 111 and a high-voltage negative-electrode lead-out piece 112. The high-voltage positive-electrode lead-out piece 111 is in contact with the second terminal of the positive disconnecting switch core 231 and an end of the positive-electrode voltage collection piece 550 for electrical connection. In this way, there is no need to arrange a conductive structure (for example, a conductive copper bar or wire) between the high-voltage positive-electrode lead-out piece 111 and the positive disconnecting switch core 231, and there is no need to arrange a conductive structure (for example, a conductive copper bar or wire) between the high-voltage positive-electrode lead-out piece 111 and the positive-electrode voltage collection piece 550. The high-voltage negative-electrode lead-out piece 112 is in contact with the first terminal of the negative disconnecting switch core 232 and an end of the negative-electrode voltage collection piece 560 for electrical connection. In this way, there is no need to arrange a conductive structure (for example, a conductive copper bar or wire) between the high-voltage negative-electrode lead-out piece 112 and the negative disconnecting switch core 232, and there is no need to arrange a conductive structure (for example, a conductive copper bar or wire) between the high-voltage negative-electrode lead-out piece 112 and the negative-electrode voltage collection piece 560.

By arranging the high-voltage positive-electrode lead-out piece 111 and the high-voltage negative-electrode lead-out piece 112, the electrical connection between the high-voltage connection part 110 and the high-voltage loop 200 can be achieved to ensure that the high-voltage connection part 110 can supply power to high-voltage electrical components of the vehicle. In addition, this can further simplify the layout of electrical connection within the power distribution apparatus 1, thereby further reducing the volume of the power distribution apparatus 1 and improving the space utilization of the power distribution apparatus 1, and reducing the weight and costs of the power distribution apparatus 1, so as to further save the space of the battery pack 2, improve the energy density of the battery pack 2, and improve battery endurance of the entire vehicle.

In some embodiments of the present disclosure, the second terminal of the positive disconnecting switch core 231, the high-voltage positive-electrode lead-out piece 111, and the end of the positive-electrode voltage collection piece 550 are in contact with each other in sequence. One of the high-voltage positive-electrode lead-out piece 111 and the positive-electrode voltage collection piece 550 is provided with a positive-electrode anti-rotation positioning groove, and the other one of the high-voltage positive-electrode lead-out piece 111 and the positive-electrode voltage collection piece 550 mates with the positive-electrode anti-rotation positioning groove. The first terminal of the negative disconnecting switch core 232, the high-voltage negative-electrode lead-out piece 112, and the end of the negative-electrode voltage collection piece 560 are in contact with each other in sequence, one of the high-voltage negative-electrode lead-out piece 112 and the negative-electrode voltage collection piece 560 is provided with a negative-electrode anti-rotation positioning groove, and the other of the high-voltage negative-electrode lead-out piece 112 and the negative-electrode voltage collection piece 560 mates with the negative-electrode anti-rotation positioning groove.

For example, the positive-electrode anti-rotation positioning groove can be arranged on the high-voltage positive-electrode lead-out piece 111, and the negative-electrode anti-rotation positioning groove can be arranged on the high-voltage negative-electrode lead-out piece 112 to reduce the probability of damage to the positive-electrode voltage collection piece 550 and the negative-electrode voltage collection piece 560, ensuring the reliability of voltage collection.

On the one hand, this can prevent the positive-electrode voltage collection piece 550 and the negative-electrode voltage collection piece 560 from being translated in the width direction of the base 100, thereby improving the stability of the electrical connection and increasing the accuracy of voltage collection. On the other hand, this can prevent the positive-electrode voltage collection piece 550 and the negative-electrode voltage collection piece 560 from rotating during the assembly process, especially in embodiments where the positive-electrode voltage collection piece 550 and the negative-electrode voltage collection piece 560 need to be installed and fixed through threaded fasteners (for example, bolts).

Further, as shown in FIG. 1 to FIG. 6, the base 100 is configured with a first positioning separation rib 130 and a second positioning separation rib 140. The first positioning separation rib 130 is located between the circuit protector 240 and the high-voltage positive-electrode lead-out piece 111 and between the circuit protector 240 and the positive-electrode voltage collection piece 550, and the second positioning separation rib 140 is located between the high-voltage positive-electrode lead-out piece 111 and the high-voltage negative-electrode lead-out piece 112 and between the positive-electrode voltage collection piece 550 and the negative-electrode voltage collection piece 560.

The first positioning separation rib 130 can separate the positive-electrode voltage collection piece 550 from the negative-electrode voltage collection piece 560 to avoid electrical connection between the circuit protector 240 and the high-voltage positive-electrode lead-out piece 111 caused by movement, can separate the circuit protector 240 from the positive-electrode voltage collection piece 550 to avoid electrical connection between the circuit protector 240 and the positive-electrode voltage collection piece 550 caused by movement, and can also position the circuit protector 240, the high-voltage positive-electrode lead-out piece 111 and the positive-electrode voltage collection piece 550 to some extent.

The second positioning separation rib 140 can separate the high-voltage positive-electrode lead-out piece 111 from the high-voltage negative-electrode lead-out piece 112 to avoid electrical connection between the high-voltage positive-electrode lead-out piece 111 and the high-voltage negative-electrode lead-out piece 112 caused by movement, can separate the positive-electrode voltage collection piece 550 from the negative-electrode voltage collection piece 560 to avoid electrical connection between the positive-electrode voltage collection piece 550 and the negative-electrode voltage collection piece 560 caused by movement, and can also position the high-voltage positive-electrode lead-out piece 111, the high-voltage negative-electrode lead-out piece 112, the positive-electrode voltage collection piece 550, and the negative-electrode voltage collection piece 560 to some extent.

In some embodiments of the present disclosure, as shown in FIG. 1 to FIG. 4, the high-voltage loop 200 further includes a current sensor 150, a first terminal of the current sensor 150 forms the negative-electrode connection end 220, and a second terminal of the current sensor 150 is electrically connected to the second terminal of the negative disconnecting switch core 232. The plurality of tabs 500 further include a current collection pin 570. A first end of the current collection pin 570 is connected to the current sensor 150. A second end of the current collection pin 570 is plugged into the circuit board 300 and is electrically connected to the low-voltage loop 400. In this way, the copper bar or wire harness between the current collection pin 570 and the circuit board 300 and between the current collection pin and the low-voltage loop 400 can be eliminated, and at the same time, the electrical connection between the current collection pin 570 and the circuit board 300 and between the current collection pin and the low-voltage loop 400 can be implemented, thereby saving space in the power distribution apparatus 1 and improving the safety of electrical connection. The current sensor 150 can be used as a high voltage supervise unit (High voltage supervise unit, HVSU).

By setting the current sensor 150, the negative-electrode connection end 220 can be formed to achieve an effective connection between the high-voltage loop 200 and the battery module 700. In addition, the circuit board 300 can obtain, through the current collection pin 570, the current of the high-voltage loop 200 collected by the current sensor 150, thereby ensuring the stability of the current of the high-voltage loop 200, which is conducive to the reliable usage of the power distribution apparatus 1. The current sensor 150 can be a shunt.

Furthermore, the second terminal of the current sensor 150 is in contact with the second terminal of the negative disconnecting switch core 232 for electrical connection. There is no need to arrange a conductive structure (for example, a conductive copper bar or wire) between the current sensor 150 and the negative disconnecting switch core 232, thereby not only reducing the risk of sintering and excessive temperature rise between the current sensor 150 and the negative disconnecting switch core 232, but also improving the space utilization of the power distribution apparatus 1 and reducing the volume of the power distribution apparatus 1 and the weight and costs of the power distribution apparatus 1.

Furthermore, as shown in FIG. 1 to FIG. 6, the base 100 is configured with a third positioning separation rib 160, and the third positioning separation rib 160 is located between the current sensor 150 and the high-voltage connection part 110.

The third positioning separation rib 160 not only can separate the current sensor 150 from the high-voltage connection part 110 to avoid incorrect electrical connection between the current sensor 150 and the high-voltage connection part 110 caused by movement, but also can position the current sensor 150 and the high-voltage connection part 110 to some extent.

In an embodiment, as shown in FIG. 1 and FIG. 4, the circuit protector 240, the positive disconnecting switch core 231, the negative disconnecting switch core 232 and the current sensor 150 are arranged in sequence along the length direction of the base 100, which facilitates contacting between a plurality of components in the high-voltage loop 200 and is conducive to eliminating a conductive structure (for example, a conductive copper bar or wire), thereby improving the space utilization of the power distribution apparatus 1 and reducing the volume and costs and weight of the power distribution apparatus 1, ensuring the reliability of the electrical connection, and avoiding damage to the high-voltage loop 200. Moreover, because the high-voltage loop 200 is mainly arranged along the length direction of the base 100, the space of the base 100 can be used more effectively.

Moreover, the low-voltage connection part 120 and the current sensor 150 are arranged along the width direction of the base 100, so that the low-voltage connection part 120 and the current sensor 150 do not need to continue to be arranged along the length of the base 100, which can reduce the length of the power distribution apparatus 1, further improve the space utilization of the power distribution apparatus 1, and reduce the weight and costs of the power distribution apparatus 1.

According to some embodiments of the present disclosure, as shown in FIG. 1, FIG. 2, FIG. 4 and FIG. 7, the high-voltage loop 200 further includes a precharge loop 170, a portion of the precharge loop 170 is integrated into the circuit board 300, and the precharge loop 170 includes a precharge resistor 180 and a precharge disconnecting switch 190. The precharge resistor 180 and the precharge disconnecting switch 190 are arranged on the base 100 and plugged into the circuit board 300. The precharge resistor 180 and the precharge disconnecting switch 190 are connected in series to each other and are connected in parallel with the disconnecting switch core 230.

The precharge resistor 180 and the precharge disconnecting switch 190 are connected in series to each other, and after the precharge resistor 180 and the precharge disconnecting switch 190 are connected in series to each other, the precharge resistor and the precharge disconnecting switch are connected in parallel to the disconnecting switch core 230. Moreover, the precharge disconnecting switch 190 and the low-voltage loop 400 are directly connected to each other, that is, there is no need to arrange a transformer structure between the precharge disconnecting switch 190 and the low-voltage loop 400.

By setting up the precharge loop 170, the battery module 700 and the disconnecting switch core 230 can be prevented from being damaged, thus ensuring safety of the battery module 700 and the disconnecting switch core 230. The circuit board 300 can control connection and disconnection of the precharge disconnecting switch 190. Moreover, the precharge disconnecting switch 190 can be directly fixed on the base 100. There is no need to arrange an additional housing for the precharge disconnecting switch 190, which can reduce the volume of the power distribution apparatus 1 and the weight and costs of the power distribution apparatus 1.

In addition, the precharge resistor 180 and the precharge disconnecting switch 190 are both plugged into the circuit board 300, and there is no need to arrange a conductive structure (for example, a conductive copper bars or wire) between the precharge resistor and the circuit board 300 and between the precharge disconnecting switch and the circuit board, which can simplify the layout of the power distribution apparatus 1, reduce the volume of the power distribution apparatus 1, and improve space utilization of the power distribution apparatus 1.

The precharge resistor 180 can be a thermistor. As the thermistor is applied to the precharge loop 170, the precharge loop 170 has a simple structure, a small volume, is easy to integrate with other components, has protection capabilities against precharge overheating, and has good adaptability to the working environments and resistance ranges.

For example, the resistance of a thermistor is relatively sensitive to temperature. When the temperature of the thermistor rises above a temperature conversion point (a Curie temperature point), the resistance rises sharply. When the thermistor is applied to the precharge loop 170, only a resistance range for normal working (between the minimum resistance and the resistance corresponding to the Curie temperature) needs to be considered. The resistance range and the allowable energy range of the thermistor can be calculated based on parameter requirements such as a voltage, a load capacitance, a precharge completion voltage difference, and a precharge time.

The minimum resistance of the thermistor is calculated as follows: $Rmin \geq tmin/(C*\ln(UB/UB-Ut))$, and the maximum resistance of the thermistor is calculated as follows: $Rmax \leq tmax/(C*\ln(UB/UB-Ut))$. tmin is the minimum precharge time, tmax is the maximum precharge time, Rmin is the minimum resistance of the thermistor, Rmax is the maximum resistance of the thermistor, C is a capacitance of a capacitive load, Ut is a corresponding terminal voltage of a capacitive load during the precharge process, and UB is a voltage of the battery module 700.

After calculating the resistance range of the thermistor, precharge time verification is performed according to a temperature-resistance property curve of the selected thermistor. Within a temperature range, such as −60° C. to 130° C., the maximum and minimum values of corresponding resistances of the thermistor within this temperature range are selected for precharge time verification.

During the precharge process of the thermistor, the maximum energy released by the precharge loop 170 to the thermistor is calculated as follows: $Ech=\frac{1}{2}CU^2$. Energy that needs to be absorbed when the temperature of a single thermistor rises from the maximum operating environment temperature Tamax to the Curie temperature Tc is Eth: Eth=Cth*(Tc−Tamax), where Cth is the heat capacity (that is, energy required to increase the temperature of the thermistor body by 1K, and the unit is joule) of the thermistor.

The thermistor should maintain a low resistance state during normal usage. Otherwise, the charging time is affected. If the energy of the charging loop is greater than allowable energy of a single thermistor, a plurality of thermistors can be connected in series or in parallel for energy decomposition, to increase the circuit voltage resistance and energy tolerance capability, that is, n*§ *Eth≥Ech. § is a reserve margin for safety that is generally 0.7 to 0.9, and n is a number of thermistors used. The number of thermistors obtained through this calculation method not only meets the requirements, but also can reduce costs.

In some embodiments of the present disclosure, a resistance range of a single thermistor can be 20Ω to 200Ω, an ambient temperature range is −60° C. to 130° C., and a single withstand voltage capability can be a withstand voltage 450 VDC and below or a withstand voltage 1000 VDC and below.

The following uses an example in which when the voltage is 400 VDC, the capacitance value of the capacitive load is 800 μf, and the charging voltage difference is 98%, a response time is within 1.5 seconds. Parameters of a single thermistor are as follows: a resistance value is 70Ω, a withstand voltage is 500 VDC, a Curie temperature is 125° C., a resistance range of the thermistor is 56Ω to 112Ω within the range of −60° C. to 125° C., and thermal capacity is 2.5 J/K. The number of used thermistors can be preliminarily selected as follows:

| | capacitance | | |
|---|---|---|---|
| Voltage | 800 μF or less (including 800) | 1500 μF (800 to 1500) | 2500 μF (1500 to 2500) |
| 500 VDC | one thermistor | two thermistors in parallel | three thermistors in parallel |
| 1000 VDC | two thermistors in series | two thermistors in parallel and two thermistors in series | three thermistors in parallel and two thermistors in series |

Verification is performed based on the above formula. Precharge is completed within 180 ms to 360 ms, the safety margin can be selected as 0.8, the maximum ambient temperature is 90° C., the energy required for the thermistor to reach the Curie temperature is 70 J, and the circuit energy is 64 J, that is, a single thermistor meets the requirement and meets the expected condition.

The above is only an explanation of certain embodiments of the present disclosure, and is to further illustrate the practical application, and is not to limit the patent scope of the present disclosure.

In addition, the plurality of tabs 500 further include a precharge low-voltage positive-electrode tab 580 and a precharge low-voltage negative-electrode tab 590. A first end of the precharge low-voltage positive-electrode tab 580 and a first end of the precharge low-voltage negative-electrode tab 590 are connected to the precharge disconnecting switch 190, and a second end of the precharge low-voltage positive-electrode tab 580 and a second end of the precharge low-voltage negative-electrode tab 590 are plugged into the circuit board 300 for electrical connection with the low-voltage loop 400.

In this way, the electrical connection between the precharge disconnecting switch 190 and the low-voltage loop 400 on the circuit board 300 can be implemented, so that the low-voltage loop 400 can control connection and disconnection of the precharge disconnecting switch 190. Besides, intermediate connectors such as conductive wires and copper bars between the precharge disconnecting switch 190 and the circuit board 300 can be eliminated, and the layout of electrical connection in the power distribution apparatus 1 can be further simplified, thereby further reducing the volume of the power distribution apparatus 1, increasing the space utilization of the power distribution apparatus 1, and reducing the weight and costs of the power distribution apparatus 1.

In some embodiments of the present disclosure, as shown in FIG. 2, the precharge disconnecting switch 190 has a precharge high-voltage positive-electrode tab 191 and a precharge high-voltage negative-electrode tab 192. The precharge resistor 180 has a resistor high-voltage tab 181. The circuit protector 240 and the precharge resistor 180 are electrically connected through contact. In this way, conductive structures such as copper bars and wire harnesses between the precharge disconnecting switch 190 and the precharge resistor 180 can be eliminated. The precharge high-voltage positive-electrode tab 191, the precharge high-voltage negative-electrode tab 192 and the resistor high-voltage tab 181 are plugged into the circuit board 300 for electrical connection with a portion of the precharge loop 170 integrated on the circuit board 300, thus eliminating existing intermediate connectors between the precharge disconnecting switch 190 and the circuit board 300 and between the precharge resistor 180 and the circuit board, that is, the copper bars and wire harnesses of the precharge part.

Figure 8:
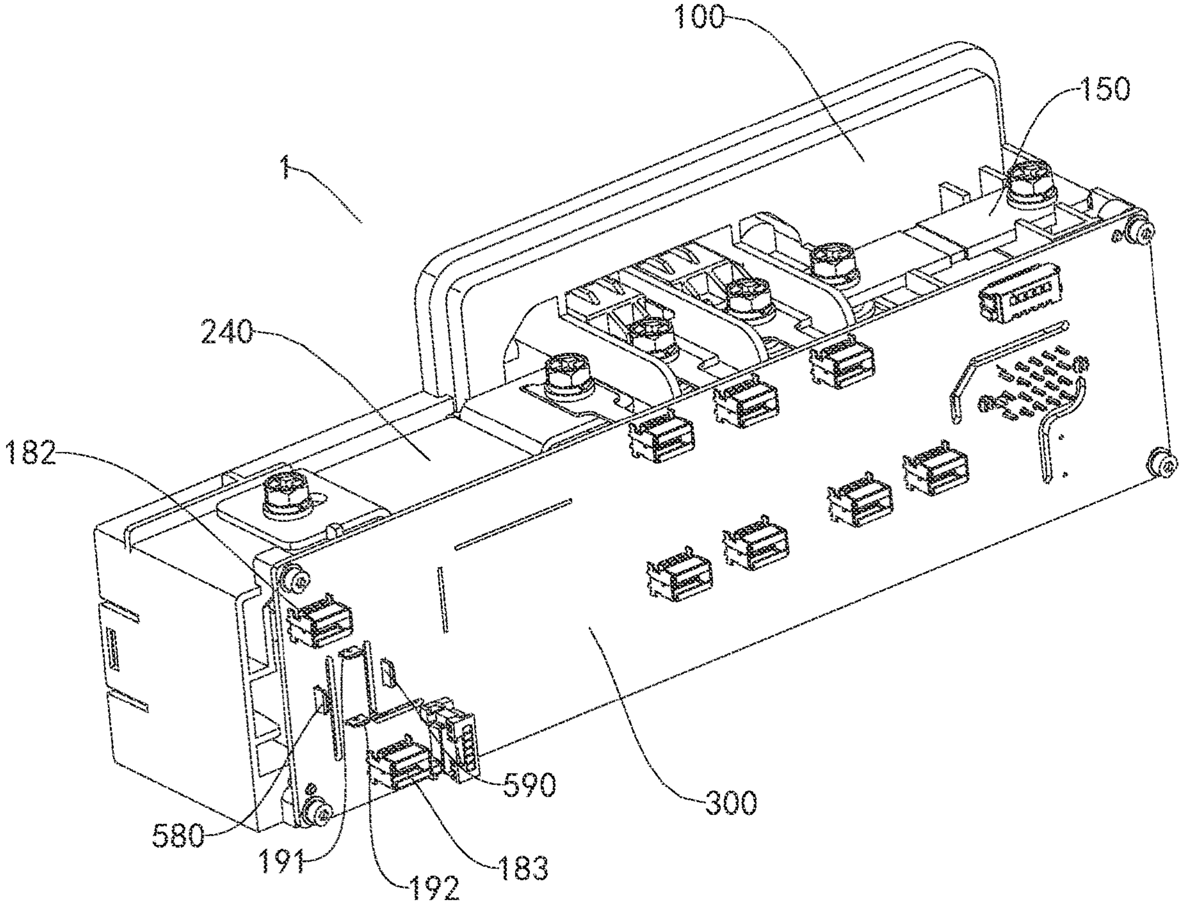
FIG. 8 is a schematic structural diagram of a power distribution apparatus according to another embodiment of the present disclosure.

In some embodiments of the present disclosure, as shown in FIG. 8, the precharge disconnecting switch 190 has a precharge high-voltage positive-electrode tab 191 and a precharge high-voltage negative-electrode tab 192, the precharge resistor 180 has a resistor high-voltage positive-electrode tab 182 and a resistor high-voltage negative-electrode tab 183, and the precharge high-voltage positive-electrode tab 191, the precharge high-voltage negative-electrode tab 192, the resistor high-voltage positive-electrode tab 182 and the resistor high-voltage negative-electrode tab 183 are plugged into the circuit board 300 for electrical connection with a portion of the precharge loop 170 integrated on the circuit board 300. In this case, there is no need to connect the precharge resistor 180 to the circuit protector 240, and the precharge resistor 180 only needs to be connected to the circuit board 300, which is easy to disassemble and assemble and easy to process.

Therefore, the electrical connection between the precharge disconnecting switch 190 and the circuit board 300 and between the precharge resistor 180 and the circuit board is more reliable, the layout is clear, and it is not prone to problems such as excessive temperature rise or sintering at the connection point. By eliminating a large number of copper bars and wire harnesses in the existing power distribution apparatus 1, the layout of electrical connections in the power distribution apparatus 1 can be further simplified, thereby further reducing the volume of the power distribution apparatus 1, improving the space utilization of the power distribution apparatus 1, and reducing the weight and costs of the power distribution apparatus 1, so as to further save the space of the battery pack 2, improve the energy density of the battery pack 2 and improve the battery endurance of the entire vehicle.

In an embodiment, as shown in FIG. 2, the precharge loop 170 also includes a precharge tab 171. A second terminal of the circuit protector 240 is electrically connected to a first terminal of the positive disconnecting switch core 231 through contacting, a first end of the precharge tab 171 is in contact between the second terminal of the circuit protector 240 and the first terminal of the positive disconnecting switch core 231, and a second end of the precharge tab 171 is plugged into the circuit board 300 and electrically connected to a portion of the precharge loop 170 integrated on the circuit board 300.

By setting the precharge tab 171, the parallel connection between the precharge loop 170 and the positive disconnecting switch core 231 can be achieved, and the precharge tab can be used to detect the voltage of the precharge loop 170. Besides, the precharge tab 171 adopts an electrical plugging method to achieve electrical connection, and there is no need to arrange a conductive structure (for example, a conductive copper bar or wire) between the precharge tab 171 and the circuit board 300, and there is no need to arrange a conductive structure (for example, a conductive copper bar or wire) between the precharge tab 171 and the connect position between the second terminal of the circuit protector 240 and the first terminal of the positive disconnecting switch core 231, which can simplify the layout of the power distribution apparatus 1, reduce the volume of the power distribution apparatus 1, and improve the space utilization of the power distribution apparatus 1.

The precharge tab 171 is integrally formed with the second terminal of the circuit protector 240. In this way, the connection strength between the precharge tab 171 and the circuit protector 240 is high, which can ensure the reliability of the electrical connection between the precharge tab 171 and the circuit protector 240.

In some embodiments of the present disclosure, as shown in FIG. 2 and FIG. 4, the precharge disconnecting switch 190, the precharge resistor 180, the positive disconnecting switch core 231, the negative disconnecting switch core 232 and the low-voltage connection part 120 are arranged in sequence along the length direction of the base 100. This further improves the space utilization of the base 100 and ensures reliable circuit connection of the power distribution apparatus 1. In addition, the precharge disconnecting switch 190, the precharge resistor 180 and the circuit protector 240 are arranged along the width direction of the base 100, so that any two of the precharge disconnecting switch 190, the precharge resistor 180 and the circuit protector 240 are staggered in the length direction of the base 100, which can reduce the length of the base 100 to a certain extent, thereby reducing the volume of the power distribution apparatus 1.

Figure 5:
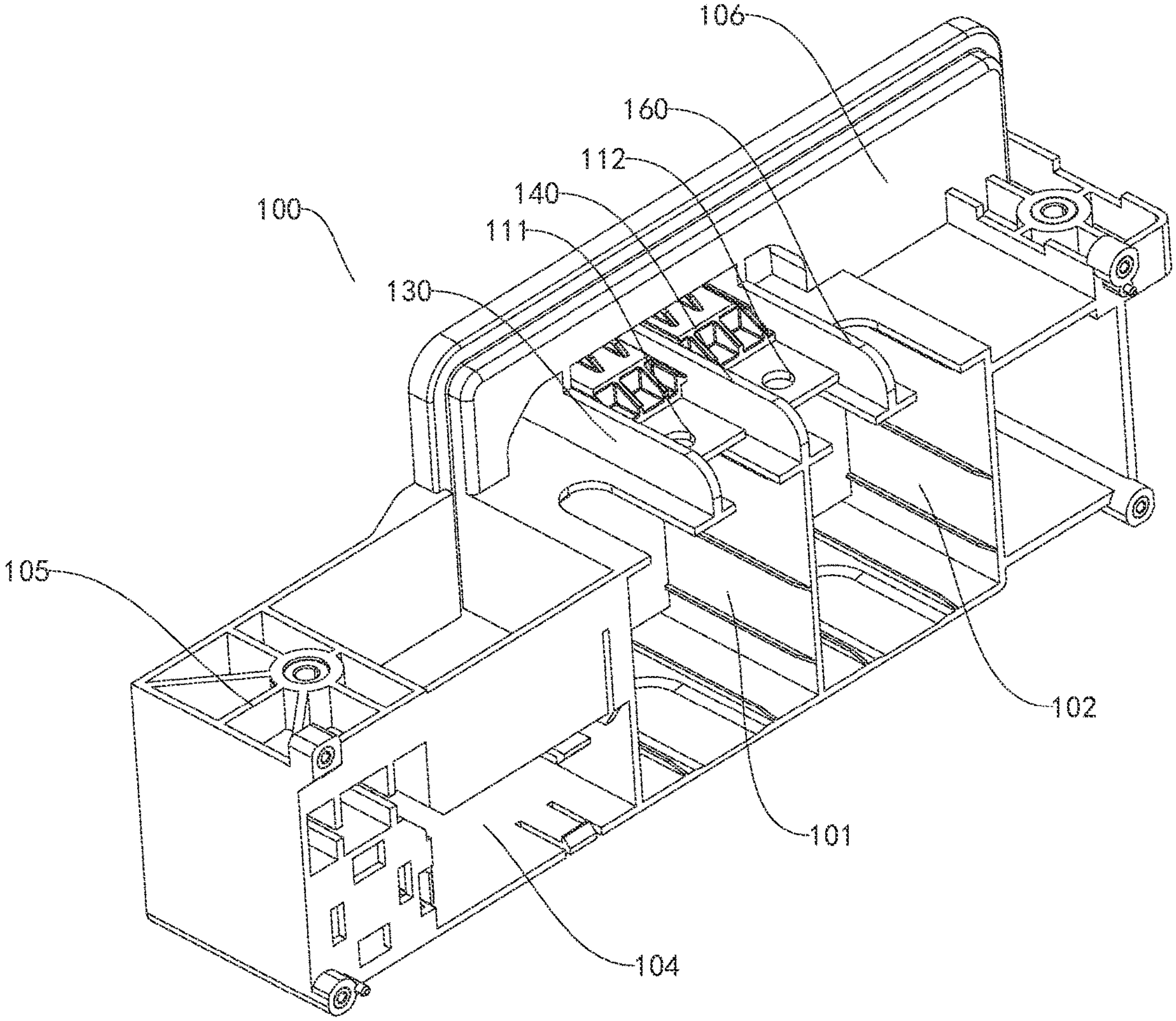
FIG. 5 is a schematic structural diagram of a base of a power distribution apparatus according to an embodiment of the present disclosure.
Figure 6:
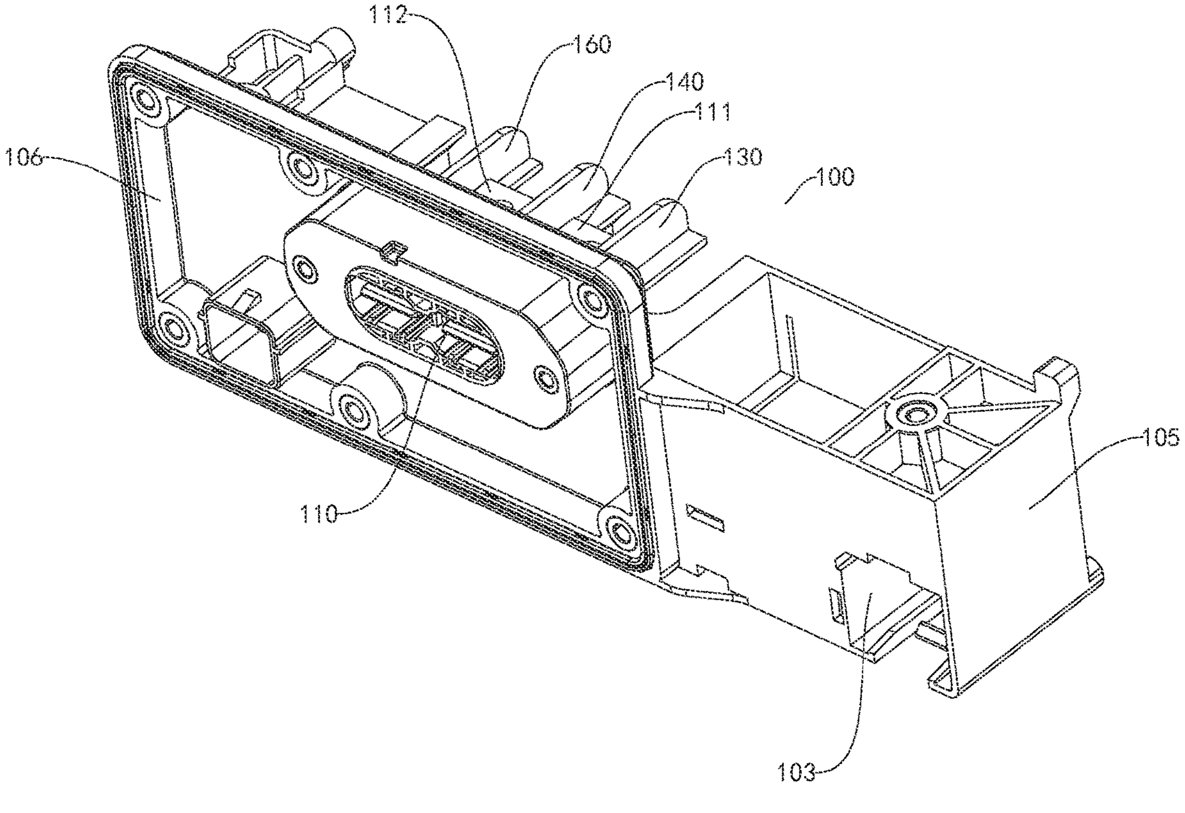
FIG. 6 is a schematic structural diagram of a base of a power distribution apparatus from another perspective according to an embodiment of the present disclosure.
Figure 7:
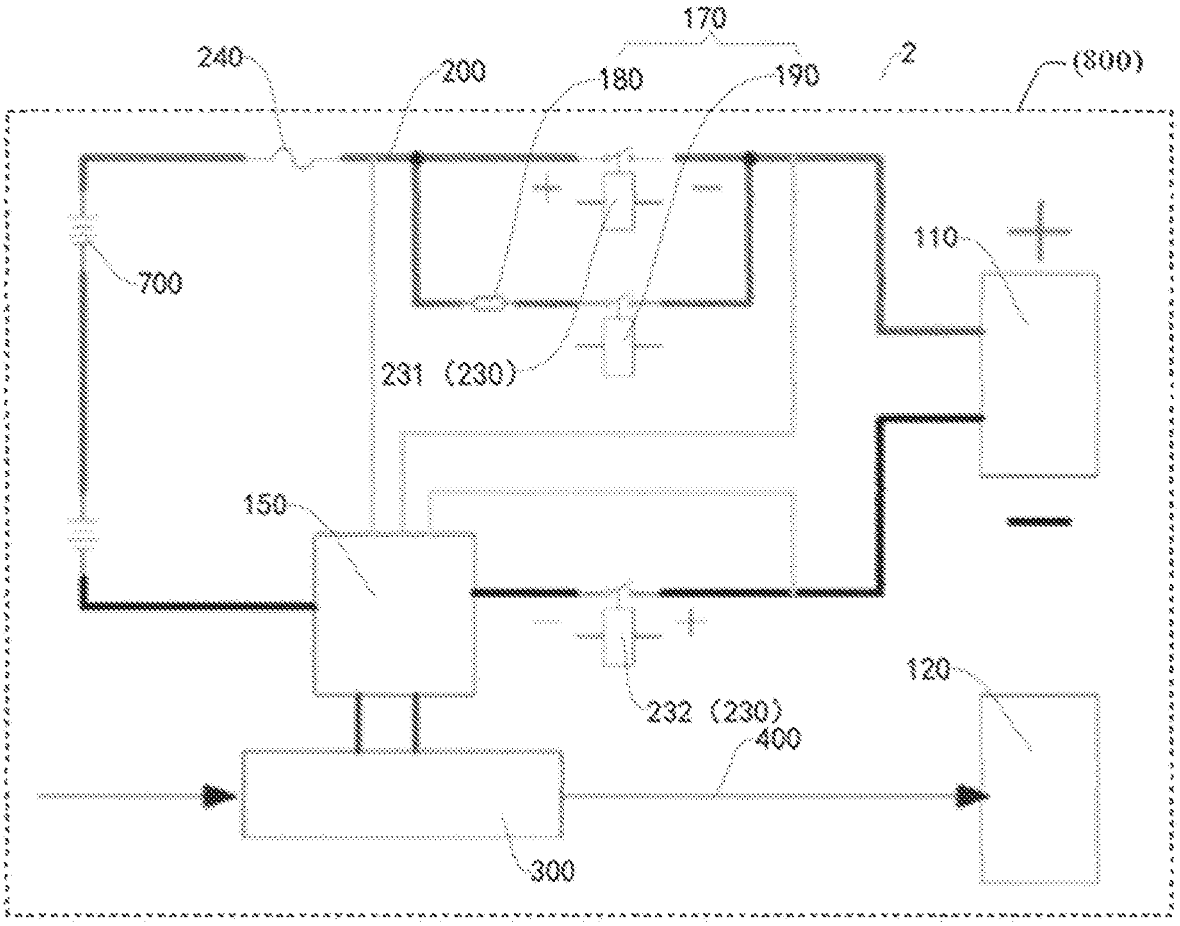
FIG. 7 is a schematic diagram of a circuit principle of a power distribution apparatus according to an embodiment of the present disclosure.

In some embodiments of the present disclosure, as shown in FIG. 2, FIG. 5 and FIG. 6, the base 100 is configured with a positive disconnecting switch core installation groove 101, a negative disconnecting switch core installation groove 102, a precharge disconnecting switch installation groove 103 and a precharge resistor installation groove 104. The positive disconnecting switch core 231 is fixed to the positive disconnecting switch core installation groove 101 through, for example, thermal conductive potting of smidahk. The negative disconnecting switch core 232 is fixed to the negative disconnecting switch core installation groove 102 through, for example, thermal conductive potting of smidahk. The precharge disconnecting switch 190 is clamped in the precharge disconnecting switch installation groove 103 or fixed to the precharge disconnecting switch installation groove 103 through, for example, thermal conductive potting of smidahk. The precharge resistor 180 is clamped in the precharge resistor installation groove 104.

In this way, the connection strength between the base 100 and each of the positive disconnecting switch core 231, the negative disconnecting switch core 232, the precharge disconnecting switch 190 and the precharge resistor 180 is higher, which can prevent the positive disconnecting switch core 231, the negative disconnecting switch core 232, the precharge disconnecting switch 190, and the precharge resistor 180 from moving relative to the base 100, thereby improving the reliability of the electrical connection in the power distribution apparatus 1.

In some embodiments of the present disclosure, as shown in FIG. 2 to FIG. 6, the base 100 includes a base body 105 and a panel 106, where the base body 105 and the panel 106 can be insulating parts, for example, made of a plastic material. At least a portion of the high-voltage loop 200 is arranged on the base body 105, the circuit board 300 is arranged on the base body 105, the panel 106 is connected to the base body 105, and the high-voltage connection part 110 and the low-voltage connection part 120 are fixed on the panel 106. This can ensure the structural strength of the base 105, and ensure the stable arrangement of the high-voltage loop 200 and the circuit board 300. In addition, the base 100 is divided into two parts, which not only facilitates the processing and manufacturing of the base body 105 and the panel 106, but also facilitates arrangement of the high-voltage loop 200, the circuit board 300 and the low-voltage loop on the base 100.

In an embodiment, the base body 105 and the panel 106 are one piece or separate pieces. It should be noted that when the base body 105 and the panel 106 are one piece, and the base body 105 and the panel 106 can be manufactured separately first. Then, the base body 105 and the panel 106 are formed into one piece to facilitate arrangement of the high-voltage loop 200, the circuit board 300 and the low-voltage loop 400. In an embodiment, the base body 105 and the panel 106 are directly injection molded once to improve the connection strength between the base body 105 and the panel 106. In this way, the setting methods of the base 100 are more diverse, so that the structure of the base 100 can be adjusted according to different usage situations, the applicability of the base 100 can be improved, and the power distribution apparatus 1 can meet the needs of different usage environments.

An assembly process of the power distribution apparatus 1 according to the embodiments of the present disclosure is described below with reference to examples.

First, potting of smidahk is used to fix the positive disconnecting switch core 231 and the negative disconnecting switch core 232 in the positive disconnecting switch core installation groove 101 and the negative disconnecting switch core installation groove 102 of the base 100 respectively.

Then, the precharge resistor 180 and the precharge disconnecting switch 190 are clamped in the precharge resistor installation groove 104 and the precharge disconnecting switch installation groove 103 of the base 100.

Next, the circuit protector 240 is placed on the base 100 and is electrically connected to the precharge resistor 180 through buckling, and bolts are used to fix the positive-electrode voltage collection piece 550, the negative-electrode voltage collection piece 560 and the current sensor 150. The circuit board 300 is fixed on the base 100. At the same time, the tabs are aligned and plugged (for example, a positive low-voltage positive-electrode tab 510, a positive low-voltage negative-electrode tab 520, a negative low-voltage positive-electrode tab 530, a negative low-voltage negative-electrode tab 540, a positive-electrode voltage collection piece 550, a negative-electrode voltage collection piece 560, a current collection pin 570, and a precharge tab 171), and the low-voltage connection part 120 on the circuit board 300 is inserted into a hole reserved on the base 100.

Finally, the base 100 is sealed.

Figure 9:
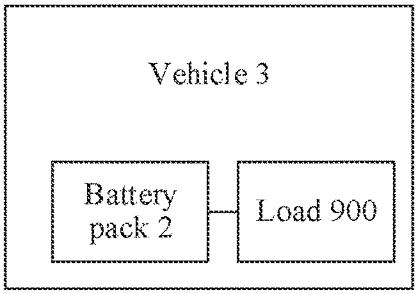
FIG. 9 is a schematic structural diagram of a vehicle according to an embodiment of the present disclosure.

A vehicle 3 according to the embodiments of the present disclosure is described below with reference to FIG. 9, and includes the battery pack 2 according to the embodiments of the present disclosure.

In the vehicle according to this embodiment of the present disclosure, the battery pack 2 in the embodiments of the present disclosure is used, which has advantages such as a simple and compact structure, high space utilization, a small size, a light weight, and low costs.

In some embodiments of the present disclosure, the vehicle further includes a load 900 electrically connected to the battery pack. This battery pack is configured to supply power to the load. The load includes an electrical component of the vehicle, for example, a motor, an air conditioning compressor, a PTC (Positive Temperature Coefficient), or a controller.

Other configurations and operations of the power distribution apparatus 1, the battery pack 2, and the vehicle 3 according to the embodiments of the present disclosure are known to those of ordinary skill in the art and will not be described in detail herein.

In the description of this specification, description of reference terms such as "a specific embodiment" or "a specific example", means including features, structures, materials, or features described in the embodiment or example in at least one embodiment or example of the present disclosure. In this specification, descriptions of the foregoing terms do not necessarily refer to the same embodiment or example.

Although embodiments of the present disclosure have been shown and described, those with ordinary skill in the art may understand that various changes, modifications, substitutions, and variations can be made to these embodiments without departing from the principles and purposes of the present disclosure, and the scope of the present disclosure is limited by the claims and their equivalents.

What is claimed is:

1. A power distribution apparatus, comprising:

a base;

a high-voltage connection part and a low-voltage connection part being fixed on the base;

a high-voltage loop, at least a portion of the high-voltage loop being disposed on the base, the high-voltage loop being electrically connected to the high-voltage connection part, the high-voltage loop having a positive-electrode connection end and a negative-electrode connection end, the high-voltage connection part comprising a high-voltage positive-electrode lead-out piece and a high-voltage negative-electrode lead-out piece, and the high-voltage loop comprising a plurality of disconnecting switch cores fixed on the base;

a circuit board disposed on the base;

a low-voltage loop integrated into the circuit board and electrically connected to the low-voltage connection part; and a plurality of tabs, a first end of each of the tabs electrically connected to the high-voltage loop, and a second end of each of the tabs plugged into the circuit board for electrical connection with the low-voltage loop, wherein:

the tabs comprise a positive-electrode voltage collection piece and a negative-electrode voltage collection piece;

the plurality of disconnecting switch cores comprise at least a positive disconnecting switch core and a negative disconnecting switch core;

a second terminal of the positive disconnecting switch core, the high-voltage positive-electrode lead-out piece, and an end of the positive-electrode voltage collection piece are in contact with each other, one of the high-voltage positive-electrode lead-out piece and the positive-electrode voltage collection piece comprises a positive-electrode anti-rotation positioning groove, and the other one of the high-voltage positive-electrode lead-out piece and the positive-electrode voltage collection piece mates with the positive-electrode anti-rotation positioning groove; and a first terminal of the negative disconnecting switch core, the high-voltage negative-electrode lead-out piece, and an end of the negative-electrode voltage collection piece are in contact with each other, one of the high-voltage negative-electrode lead-out piece and the negative-electrode voltage collection piece comprises a negative-electrode anti-rotation positioning groove, and the other one of the high-voltage negative-electrode lead-out piece and the negative-electrode voltage collection piece mates with the negative-electrode anti-rotation positioning groove.

2. The power distribution apparatus according to claim 1, wherein the high-voltage loop is electrically connected with the high-voltage connection part;

the low-voltage connection part is plugged into the circuit board for electrical connection with the low-voltage loop; and components connected in the high-voltage loop are electrically connected with each other.

3. The power distribution apparatus according to claim 1, wherein the high-voltage loop further comprises a circuit protector, the circuit protector is disposed on the base, and a first terminal of the circuit protector forms the positive-electrode connection end;

a second terminal of the circuit protector is electrically connected to a first terminal of the positive disconnecting switch core, and the second terminal of the positive disconnecting switch core and the first terminal of the negative disconnecting switch core are electrically connected to the high-voltage connection part; and the tabs further comprise a positive low-voltage positive-electrode tab, a positive low-voltage negative-electrode tab, a negative low-voltage positive-electrode tab, and a negative low-voltage negative-electrode tab, a first end of the positive low-voltage positive-electrode tab and a first end of the positive low-voltage negative-electrode tab are connected to the positive disconnecting switch core, a second end of the positive low-voltage positive-electrode tab and a second end of the positive low-voltage negative-electrode tab are plugged into the circuit board and are electrically connected to the low-voltage loop, a first end of the negative low-voltage positive-electrode tab and a first end of the negative low-voltage negative-electrode tab are connected to the negative disconnecting switch core, and a second end of the negative low-voltage positive-electrode tab and a second end of the negative low-voltage negative-electrode tab are plugged into the circuit board for electrical connection with the low-voltage loop.

4. The power distribution apparatus according to claim 3, wherein the second terminal of the circuit protector is electrically connected with the first terminal of the positive disconnecting switch core; and the second terminal of the positive disconnecting switch core and the first terminal of the negative disconnecting switch core are electrically connected with the high-voltage connection part.

5. The power distribution apparatus according to claim 4, wherein:

a first end of the positive-electrode voltage collection piece is connected between the second terminal of the positive disconnecting switch core and the high-voltage connection part, and a second end of the positive-electrode voltage collection piece is plugged into the circuit board and electrically connected to the low-voltage loop; and a first end of the negative-electrode voltage collection piece is connected between the first terminal of the negative disconnecting switch core and the high-voltage connection part, and a second end of the negative-electrode voltage collection piece is plugged into the circuit board and electrically connected to the low-voltage loop.

6. The power distribution apparatus according to claim 3, wherein the base comprises a first positioning separation rib and a second positioning separation rib;

the first positioning separation rib is located between the circuit protector and the high-voltage positive-electrode lead-out piece, and is located between the circuit protector and the positive-electrode voltage collection piece; and the second positioning separation rib is located between the high-voltage positive-electrode lead-out piece and the high-voltage negative-electrode lead-out piece, and is located between the positive-electrode voltage collection piece and the negative-electrode voltage collection piece.

7. The power distribution apparatus according to claim 3, wherein the high-voltage loop further comprises a current sensor, a first terminal of the current sensor forms the negative-electrode connection end, and a second terminal of the current sensor is electrically connected to a second terminal of the negative disconnecting switch core; and the tabs further comprise a current collection pin, a first end of the current collection pin is connected to the current sensor, and a second end of the current collection pin is plugged into the circuit board and is electrically connected to the low-voltage loop.

8. The power distribution apparatus according to claim 7, wherein the second terminal of the current sensor is electrically connected with the second terminal of the negative disconnecting switch core.

9. The power distribution apparatus according to claim 7, wherein the base is configured with a third positioning separation rib, and the third positioning separation rib is located between the current sensor and the high-voltage connection part.

10. The power distribution apparatus according to claim 9, wherein the circuit protector, the positive disconnecting switch core, the negative disconnecting switch core, and the current sensor are disposed along a length direction of the base; and the low-voltage connection part and the current sensor are disposed along a width direction of the base.

11. The power distribution apparatus according to claim 3, wherein the high-voltage loop further comprises a precharge loop, a portion of the precharge loop is integrated into the circuit board, the precharge loop comprises a precharge resistor and a precharge disconnecting switch, the precharge resistor and the precharge disconnecting switch are disposed on the base and plugged into the circuit board, and the precharge resistor and the precharge disconnecting switch are connected in series to each other and in parallel with a corresponding disconnecting switch core; and the tabs further comprise a precharge low-voltage positive-electrode tab and a precharge low-voltage negative-electrode tab, a first end of the precharge low-voltage positive-electrode tab and a first end of the precharge low-voltage negative-electrode tab are connected to the precharge disconnecting switch, and a second end of the precharge low-voltage positive-electrode tab and a second end of the precharge low-voltage negative-electrode tab are plugged into the circuit board for electrical connection with the low-voltage loop.

12. The power distribution apparatus according to claim 11, wherein the precharge disconnecting switch comprises a precharge high-voltage positive-electrode tab and a precharge high-voltage negative-electrode tab, the precharge resistor comprises a resistor high-voltage tab, the circuit protector and the precharge resistor are electrically connected to each other, and the precharge high-voltage positive-electrode tab, the precharge high-voltage negative-electrode tab, and the resistor high-voltage tab are plugged into the circuit board and in electrical connection with the portion of the precharge loop integrated on the circuit board; or the precharge disconnecting switch comprises the precharge high-voltage positive-electrode tab and the precharge high-voltage negative-electrode tab, the precharge resistor comprises a resistor high-voltage positive-electrode tab and a resistor high-voltage negative-electrode tab, and the precharge high-voltage positive-electrode tab, the precharge high-voltage negative-electrode tab, the resistor high-voltage positive-electrode tab, and the resistor high-voltage negative-electrode tab are plugged into the circuit board and in electrical connection with the portion of the precharge loop integrated on the circuit board.

13. The power distribution apparatus according to claim 11, wherein the precharge loop further comprises:

a precharge tab, the second terminal of the circuit protector electrically connected with the first terminal of the positive disconnecting switch core, a first end of the precharge tab being connected between the second terminal of the circuit protector and the first terminal of the positive disconnecting switch core, and a second end of the precharge tab being plugged into the circuit board and electrically connected to the portion of the precharge loop integrated on the circuit board.

14. The power distribution apparatus according to claim 13, wherein the precharge tab is integrally formed with the second terminal of the circuit protector.

15. The power distribution apparatus according to claim 11, wherein the precharge disconnecting switch, the precharge resistor, the positive disconnecting switch core, the negative disconnecting switch core, and the low-voltage connection part are disposed along a length direction of the base; and the precharge disconnecting switch, the precharge resistor, and the circuit protector are disposed along a width direction of the base.

16. The power distribution apparatus according to claim 11, wherein the base comprises a positive disconnecting switch core installation groove, a negative disconnecting switch core installation groove, a precharge disconnecting switch installation groove, and a precharge resistor installation groove;

the positive disconnecting switch core is fixed to the positive disconnecting switch core installation groove;

the negative disconnecting switch core is fixed to the negative disconnecting switch core installation groove;

the precharge disconnecting switch is clamped in the precharge disconnecting switch installation groove or fixed to the precharge disconnecting switch installation groove; and the precharge resistor is clamped in the precharge resistor installation groove.

17. A battery pack, comprising:

a housing;

a power distribution apparatus disposed in the housing, the power distribution apparatus comprising:

a base;

a high-voltage connection part and a low-voltage connection part being fixed on the base;

a high-voltage loop, at least a portion of the high-voltage loop being disposed on the base, the high-voltage loop being electrically connected to the high-voltage connection part, the high-voltage loop having a positive-electrode connection end and a negative-electrode connection end, the high-voltage connection part comprising a high-voltage positive-electrode lead-out piece and a high-voltage negative-electrode lead-out piece, and the high-voltage loop comprising a plurality of disconnecting switch cores fixed on the base;

a circuit board disposed on the base;

a low-voltage loop integrated into the circuit board and electrically connected to the low-voltage connection part; and a plurality of tabs, a first end of each of the tabs electrically connected to the high-voltage loop, and a second end of each of the tabs plugged into the circuit board for electrical connection with the low-voltage loop, wherein:

the tabs comprise a positive-electrode voltage collection piece and a negative-electrode voltage collection piece;

the plurality of disconnecting switch cores comprise at least a positive disconnecting switch core and a negative disconnecting switch core;

a second terminal of the positive disconnecting switch core, the high-voltage positive-electrode lead-out piece, and an end of the positive-electrode voltage collection piece are in contact with each other, one of the high-voltage positive-electrode lead-out piece and the positive-electrode voltage collection piece comprises a positive-electrode anti-rotation positioning groove, and the other one of the high-voltage positive-electrode lead-out piece and the positive-electrode voltage collection piece mates with the positive-electrode anti-rotation positioning groove; and a first terminal of the negative disconnecting switch core, the high-voltage negative-electrode lead-out piece, and an end of the negative-electrode voltage collection piece are in contact with each other, one of the high-voltage negative-electrode lead-out piece and the negative-electrode voltage collection piece comprises a negative-electrode anti-rotation positioning groove, and the other one of the high-voltage negative-electrode lead-out piece and the negative-electrode voltage collection piece mates with the negative-electrode anti-rotation positioning groove;

the high-voltage connection part and the low-voltage connection part being exposed from the housing; and a battery module located in the housing and electrically connected to the positive-electrode connection end and the negative-electrode connection end.

18. A vehicle, comprising a battery pack and a load electrically connected to the battery pack, the battery pack, comprising:

a housing;

a power distribution apparatus disposed in the housing, the power distribution apparatus comprising:

a base;

a high-voltage connection part and a low-voltage connection part being fixed on the base;

a high-voltage loop, at least a portion of the high-voltage loop being disposed on the base, the high-voltage loop being electrically connected to the high-voltage connection part, the high-voltage loop having a positive-electrode connection end and a negative-electrode connection end, the high-voltage connection part comprising a high-voltage positive-electrode lead-out piece and a high-voltage negative-electrode lead-out piece, and the high-voltage loop comprising a plurality of disconnecting switch cores fixed on the base;

a circuit board disposed on the base;

a low-voltage loop integrated into the circuit board and electrically connected to the low-voltage connection part; and a plurality of tabs, a first end of each of the tabs electrically connected to the high-voltage loop, and a second end of each of the tabs plugged into the circuit board for electrical connection with the low-voltage loop, wherein:

the tabs comprise a positive-electrode voltage collection piece and a negative-electrode voltage collection piece;

the plurality of disconnecting switch cores comprise at least a positive disconnecting switch core and a negative disconnecting switch core;

a second terminal of the positive disconnecting switch core, the high-voltage positive-electrode lead-out piece, and an end of the positive-electrode voltage collection piece are in contact with each other, one of the high-voltage positive-electrode lead-out piece and the positive-electrode voltage collection piece comprises a positive-electrode anti-rotation positioning groove, and the other one of the high-voltage positive-electrode lead-out piece and the positive-electrode voltage collection piece mates with the positive-electrode anti-rotation positioning groove; and a first terminal of the negative disconnecting switch core, the high-voltage negative-electrode lead-out piece, and an end of the negative-electrode voltage collection piece are in contact with each other, one of the high-voltage negative-electrode lead-out piece and the negative-electrode voltage collection piece comprises a negative-electrode anti-rotation positioning groove, and the other one of the high-voltage negative-electrode lead-out piece and the negative-electrode voltage collection piece mates with the negative-electrode anti-rotation positioning groove;

the high-voltage connection part and the low-voltage connection part being exposed from the housing; and a battery module located in the housing and electrically connected to the positive-electrode connection end and the negative-electrode connection end.

* * * * *